United States Patent [19]
Yamagishi

[11] Patent Number: 5,365,091
[45] Date of Patent: Nov. 15, 1994

[54] SEMICONDUCTOR INTEGRATED CIRCUIT DEVICE

[75] Inventor: Mikio Yamagishi, Ohme, Japan

[73] Assignee: Hitachi, Ltd., Tokyo, Japan

[21] Appl. No.: 65,053

[22] Filed: May 24, 1993

[30] Foreign Application Priority Data

Jun. 11, 1992 [JP] Japan ................................. 4-150998

[51] Int. Cl.$^5$ ...................... H01L 27/02; H01L 27/10
[52] U.S. Cl. ................................... 257/203; 257/208; 257/211; 257/758; 257/773
[58] Field of Search ............... 257/203, 207, 208, 211, 257/758, 773

[56] References Cited

U.S. PATENT DOCUMENTS 5,083,181  1/1992  Yoshida et al. ..................... 257/203

FOREIGN PATENT DOCUMENTS

0349294A1  1/1990  European Pat. Off. .

OTHER PUBLICATIONS

Takeuchi et al., "Gate Arrays", from 1988 IEEE International Solid–State Circuits Conference, Feb. 17, 1988, published in 1988 IEEE Digest of Technical Papers, 1988, pp. 72–73, 307.

*Primary Examiner*—Mark V. Prenty
*Attorney, Agent, or Firm*—Pennie & Edmonds

[57] ABSTRACT

A semiconductor integrated circuit device comprises a plurality of peripheral power supply lines extending along the periphery of an internal circuit region formed in a semiconductor chip. Bonding pads are arranged outside of the peripheral power supply lines, wherein the wiring layers used in the peripheral power supply line arranged at the outermost periphery are made less by one than those used in the inner peripheral power supply line adjacent to the outermost peripheral power supply line. Reduced wiring layers are formed with power leading lines for connecting the inner peripheral power supply line and the bonding pads. Moreover, the power leading lines for connecting the outermost peripheral power supply lines and the bonding pads are formed of the same wiring layer as that of the outermost peripheral power supply line. The semiconductor integrated circuit device is further constructed such that there are arranged along the peripheral of the internal circuit region a plurality of I/O cells and high drive power output buffer circuits which include two or more adjacent ones of the plurality of I/O cells and which are adapted to be fed with the supply voltages from the peripheral power supply lines. Moreover, predetermined ones of external terminals assigned to the plurality of I/O cells constituting the high drive power output buffer circuits are used as terminals for feeding the supply voltages to the plurality of peripheral power supply lines.

19 Claims, 16 Drawing Sheets

SEMICONDUCTOR INTEGRATED CIRCUIT DEVICE

BACKGROUND OF THE INVENTION

The present invention relates to a technology for a semiconductor integrated circuit device and, more particularly, to a technology which is particularly effective for a semiconductor integrated circuit device with a special application such as an ASIC (Application Specific Integrated Circuit).

A gate array exemplifies a semiconductor integrated circuit device representing the ASIC.

The gate array is disclosed on pp. 72 to 73, 307 of Digest of Technical Papers, ISSCC (International Solid-State Circuits Conference), 1988, for example.

A semiconductor chip constructing the gate array is usually arranged with an internal circuit region. This internal circuit region is arranged with a plurality of basic cells.

The basic cell is a cell which is arranged with semiconductor integrated circuit elements such as transistors necessary for constituting one basic circuit (e.g., a gate circuit). The wiring connections between the basic circuits of the individual basic cells are changed to form a desired semiconductor integrated circuit in the internal circuit region.

This internal circuit region is arranged therearound with a peripheral circuit region. This peripheral circuit region is arranged with a plurality of input/output circuit (as will be shortly expressed as I/O) cells. The I/O cells are cells which are arranged with semiconductor integrated circuit elements such as transistors necessary for constituting an input/output circuit such as a standard input buffer circuit or a standard output buffer circuit. Each of the I/O cells is arranged with one corresponding bonding pad.

Over the I/O cells, on the other hand, there are arranged a plurality of peripheral power supply lines which are extended along the internal circuit region. The peripheral power supply lines are lines for feeding the power voltages to the input/output circuits of the peripheral circuit region and the semiconductor integrated circuits of the internal circuit region. The peripheral power supply lines are usually divided into two kinds: a peripheral power supply line for feeding a reference voltage $V_{SS}$ of about 0 V; and a peripheral power supply line for feeding a higher potential $V_{DD}$ of about 5 V.

The construction of tile I/O cells of the gate array is disclosed in EP (i.e., European Patent)-A-0349294, for example. On the other hand, the peripheral power supply lines are disclosed in U.S. Pat. No. 5,083,181, for example.

SUMMARY OF THE INVENTION

The peripheral power supply line for the $V_{DD}$ and the peripheral power supply line for the $V_{SS}$ are extended in parallel with each other. The peripheral power supply line for the $V_{SS}$ is usually arranged at the outer side of the peripheral power supply line for the $V_{DD}$, for example. Here, if a semiconductor integrated circuit device having a three-layered wiring structure is taken up as an example, not only the $V_{DD}$ peripheral power supply line but also the $V_{SS}$ peripheral power supply line is formed in the second wiring layer and the third wiring layer.

The first wiring layer is left mainly for constituting the input/output circuits.

We have found the following problems in the semiconductor integrated circuit device when the driving force of an output buffer circuit is to be intensified so as to improve the operating speed.

In the gate array, for example, the individual transistors of two or more adjacent I/O cells are used to form one output buffer circuit having a high driving force (as will be called the "high drive power output buffer circuit").

If, however, the high drive power output buffer circuit is arranged, a high current flows through the peripheral power supply lines at the time of driving the output buffer circuit, for example, in which case the potential of the peripheral power supply lines can invariably fluctuate which can cause a malfunction in the semiconductor integrated circuit device.

As an answer for this problem, it is conceivable to intensify the power supply by feeding the supply voltage to the peripheral power supply lines from the bonding pads corresponding to the I/O cells near the high drive power output buffer circuit, for example.

In other words, the leading lines from the $V_{SS}$ peripheral power supply line arranged at the outermost periphery to the bonding pads can be arranged without using the first wiring layer constituting the semiconductor integrated circuit and the input/output circuits.

However, the leading lines from the $V_{DD}$ peripheral power supply line 8 to the bonding pads have to be arranged while avoiding the $V_{SS}$ peripheral power supply line arranged outside of the $V_{DD}$ peripheral power supply line.

In this case, therefore, the $V_{DD}$ peripheral power supply line is dropped by through holes to the first wiring layer so that the lines to the bonding pads are led out by using the first wiring layer. As a result, the input/output circuits cannot be connected by the first wiring layer with the I/O cells which are formed of the first wiring layer, so that the I/O cells are used only for connections with the $V_{DD}$ peripheral power supply line.

More specifically, the power supply for both the $V_{SS}$ and $V_{DD}$ peripheral power supply lines cannot be intensified in the semiconductor integrated circuit device having the high drive power output buffer circuits without sacrificing the I/O cells adjacent to the I/O cells constituting the high drive power output buffer circuits. The resultant problem is an increase in the chip size. In case the high drive power output buffer circuits are arranged continuously in plurality, we have found it difficult to suppress the fluctuations of the supply potentials sufficiently even if the I/O cells adjacent to the I/O cells constituting the high drive power output buffer circuit at the end portion are used for intensifying the power supply.

On the other hand, it is also conceivable to intensify only the $V_{SS}$ peripheral power supply line. This concept is effective not only for the noise due to the fluctuations of the supply potentials but also for suppressing the delay in the breakage of signals. If, however, only the $V_{SS}$ peripheral power supply line but not the $V_{DD}$ peripheral power supply line is intensified, this intensification is not sufficient for suppressing the delay in the rise of signals arises a problem of obstructing the improvement in the operating speed of the semiconductor integrated circuit device.

In case of the high drive power output buffer circuit formed of two I/O cells, for example, the bonding pad assigned to one I/O cell is used as the output terminal of the high drive power output buffer circuit, but the bonding pad of the other I/O cell cannot be used as the other signal leading terminal, because the I/O cell is used for forming the high drive power output buffer circuit. Thus, there arises a problem in that the bonding pad of the other I/O cell is useless.

The present invention has been conceived in view of the above-specified problems and has an object to provide a technology for suppressing the potential fluctuations of the peripheral power supply lines of a semiconductor integrated circuit device having high drive power output buffer circuits, without sacrificing any I/O cell.

Another object of the present invention is to provide a technology capable of improving the operating speed of the semiconductor integrated circuit device having the high drive power output buffer circuits without sacrificing any I/O cell.

Still another object of the present invention is to provide a technology capable of using external terminals effectively in the semiconductor integrated circuit device having the high drive power output buffer circuits.

The foregoing and other objects and novel features of the present invention will become apparent from the following description to be made with reference to the accompanying drawings.

Representatives of the invention to be disclosed herein will be briefly summarized in the following.

According to a first aspect of the present invention, there is provided a semiconductor integrated circuit device comprising: a plurality of peripheral power supply lines extended along the periphery of an internal circuit region formed in a semiconductor chip; and bonding pads arranged outside of said peripheral power supply lines, wherein the wiring layers used in the peripheral power supply line arranged at the outermost periphery are made less by one than those used in the inner peripheral power supply line adjacent to the outermost peripheral power supply line, and wherein the reduced wiring layers are formed with power leading lines for connecting the inner peripheral power supply line and said bonding pads.

Moreover, the semiconductor integrated circuit device is constructed such that the outermost one of the plurality of peripheral power supply lines is wider than the other peripheral power supply line.

According to a second aspect of the present invention, the semiconductor integrated circuit device is constructed such that there are arranged along the peripheral of the internal circuit region a plurality of I/O cells and high drive power output buffer circuits which include two or more adjacent ones of the plurality of I/O cells and which are adapted to be fed with the supply voltages from said peripheral power supply lines, and such that predetermined ones of external terminals assigned to the plurality of I/O cells constituting said high drive power output buffer circuits are used as terminals for feeding the supply voltages to said plurality of peripheral power supply lines.

Moreover, the semiconductor integrated circuit device is constructed such that said high drive power output buffer circuits are arranged continuously in plurality, and such that power leading lines led from the plurality of peripheral power supply lines to said predetermined external terminals are arranged at the two sides of the signal leading lines led from said high drive power output buffer circuits to the external terminals.

According to the aforementioned first aspect, the inner peripheral power supply line can be led out from any position of the semiconductor chip without using the wiring layers constituting the semiconductor integrated circuits and the input/output circuits.

Moreover, it is possible to compensate the reduction in the sectional area of the lines due to the reduction of the usable wiring layer of the outermost peripheral power supply line.

According to the aforementioned second aspect, the external terminals, which are assigned to the I/O cells constituting the high drive power output buffer circuits but are useless in the prior art, are used as the power supplying terminals for the peripheral power supply lines so that the external terminals can be effectively used to intensify the power supply to the peripheral power supply lines without inviting any increase in the chip size.

Moreover, by sandwiching the signal leading lines led out from the high drive power output buffer circuits between the power leading line at the reference potential and the power leading line at a potential higher than the reference potential, the signal leading lines can be shielded to suppress the coupling between the signal leading lines. Still moreover, the mutual inductance between the signal leading lines and the power leading lines can be increased to reduce the effective inductance of the signal leading lines.

DESCRIPTION OF THE PREFERRED EMBODIMENTS

[Embodiment 1]

Figure 1:
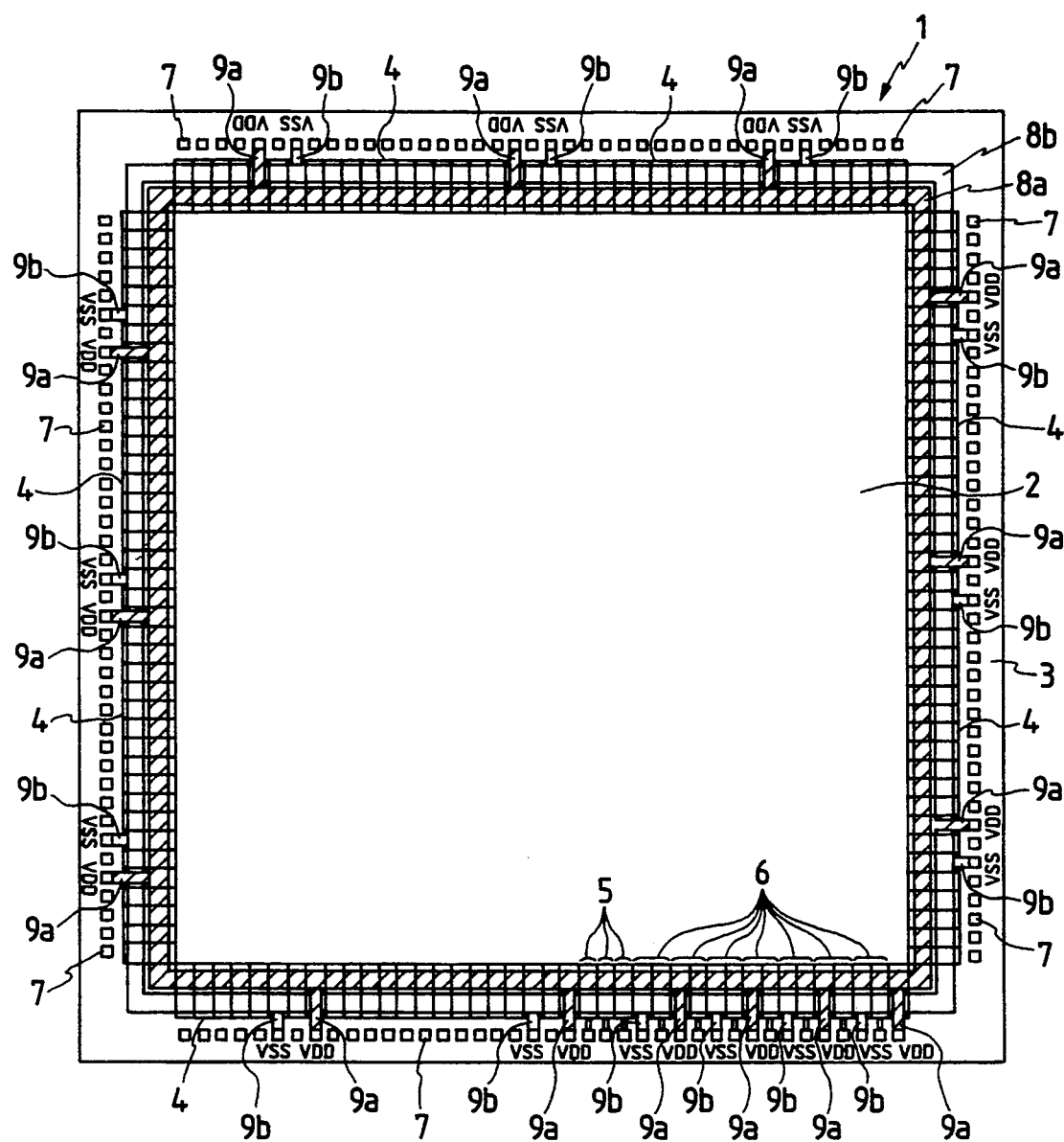
FIG. 1 is an overall top plan view showing a semiconductor chip constituting a semiconductor integrated circuit device according to one embodiment of the present invention.
Figure 2:
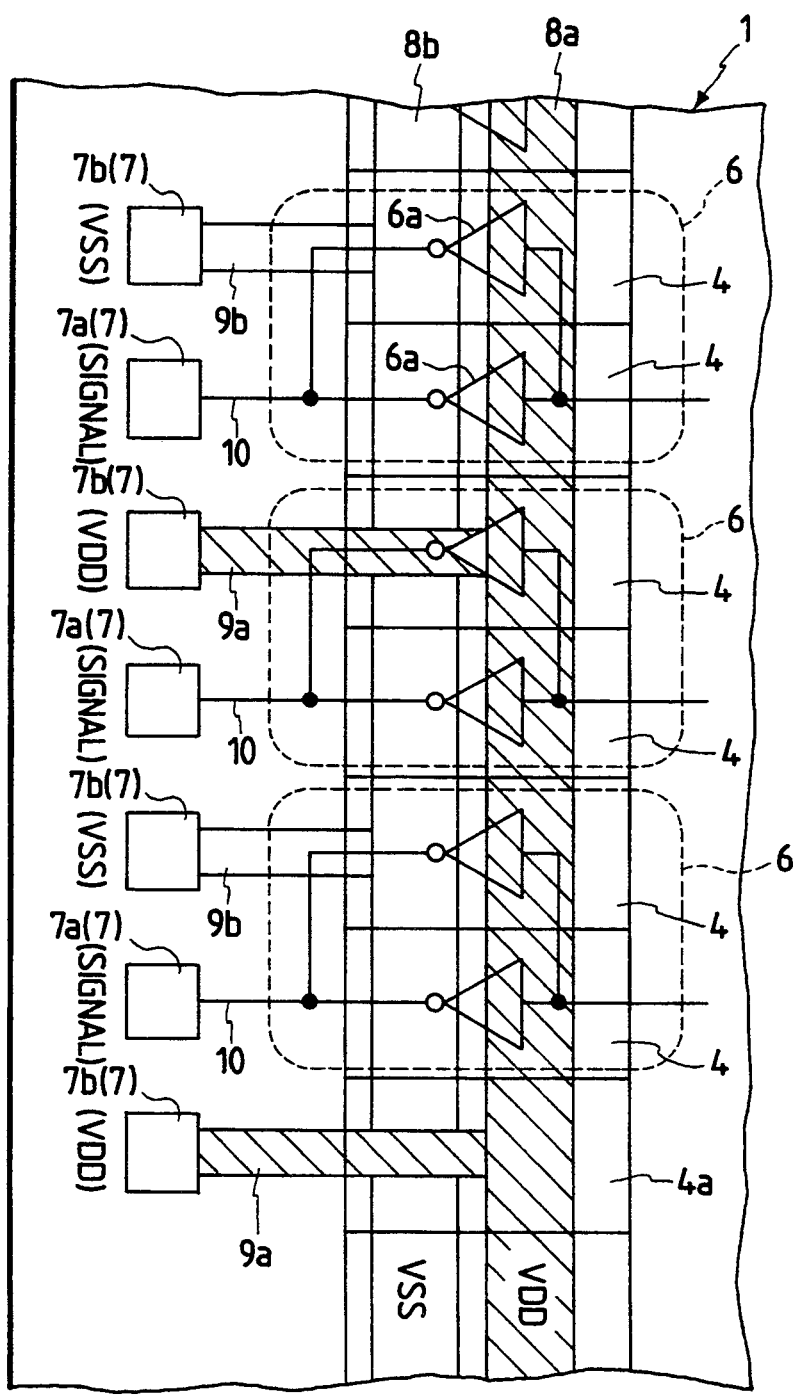
FIG. 2 is a enlarged top plan view of an essential portion of a semiconductor chip and schematically shows a high-driving power buffer circuit forming region of the semiconductor integrated circuit device of FIG. 1.
Figure 3:
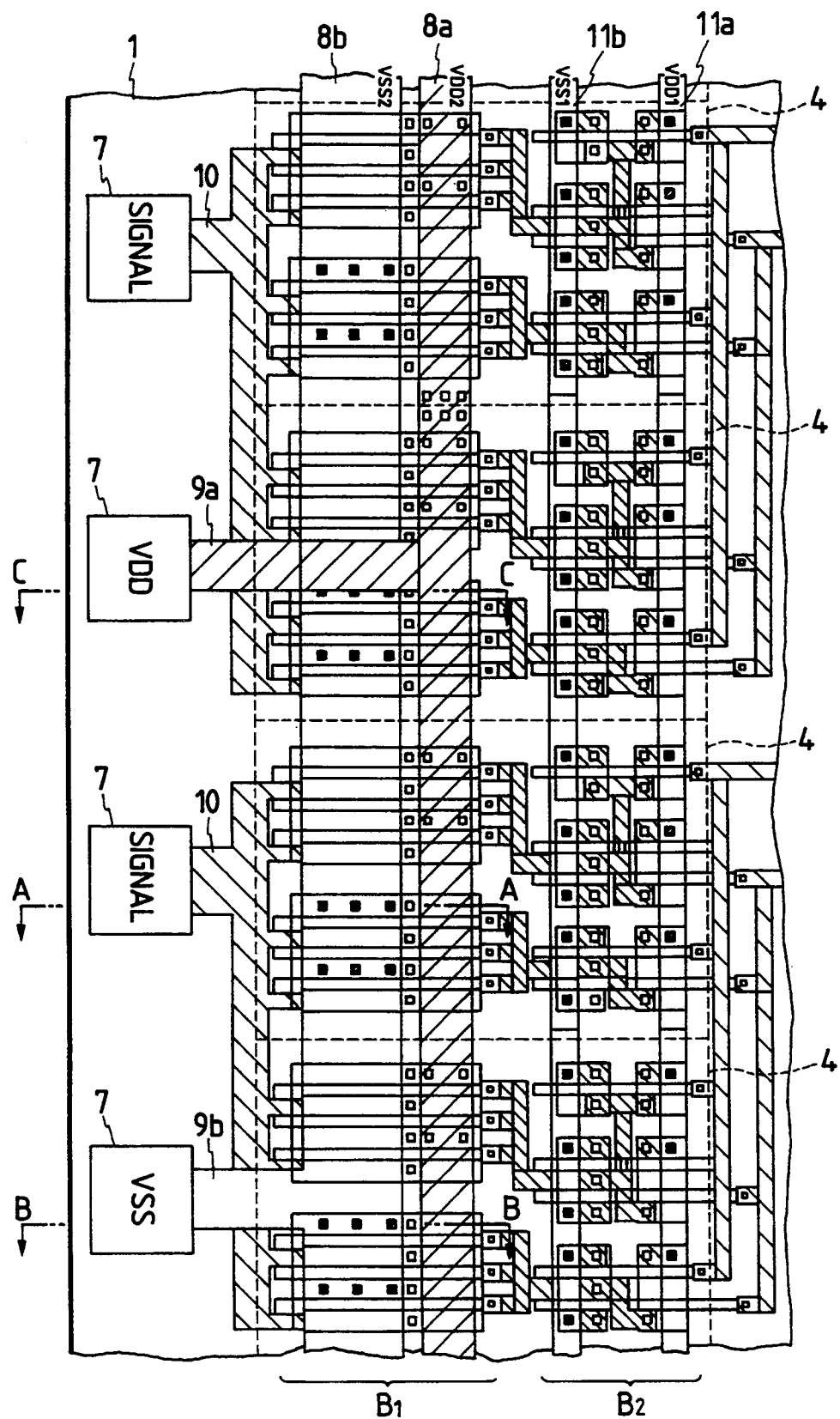
FIG. 3 is a enlarged top plan view of an essential portion of a semiconductor chip for explaining the high-driving power buffer circuit forming region in detail.
Figure 4:
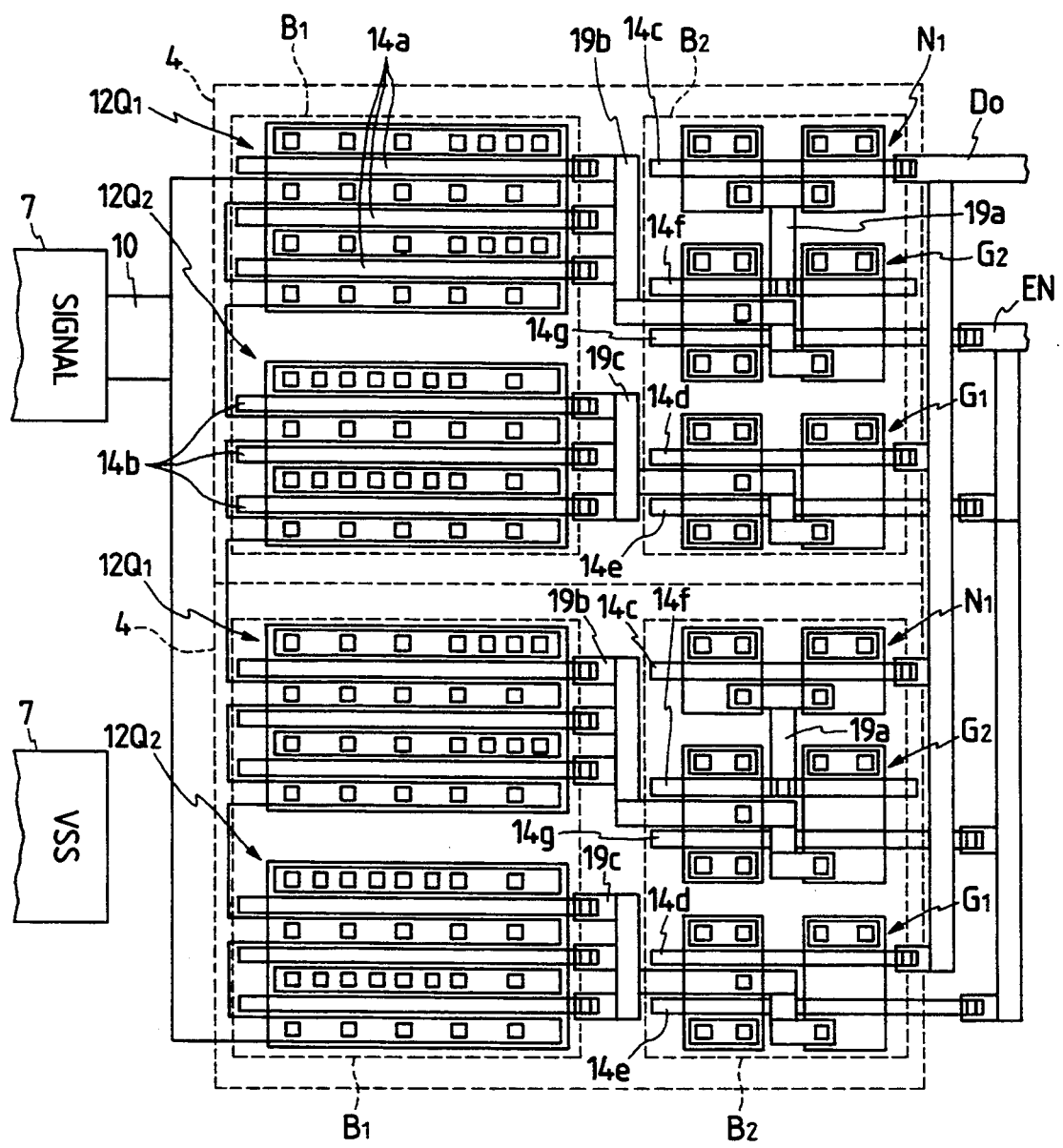
FIG. 4 is an enlarged top plan view showing an essential portion of FIG. 3.
Figure 5:
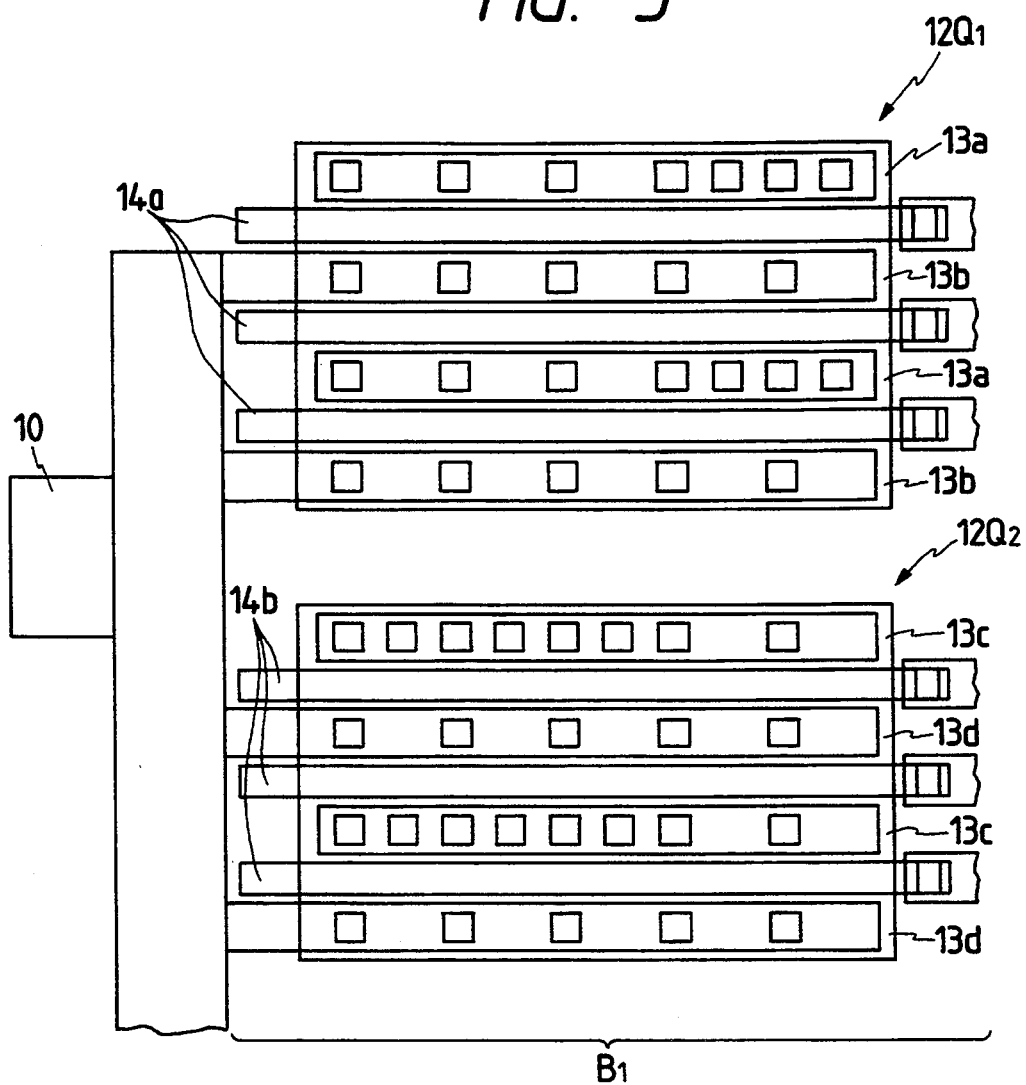
FIG. 5 is an enlarged top plan view showing an essential portion of FIG. 4.
Figure 6:
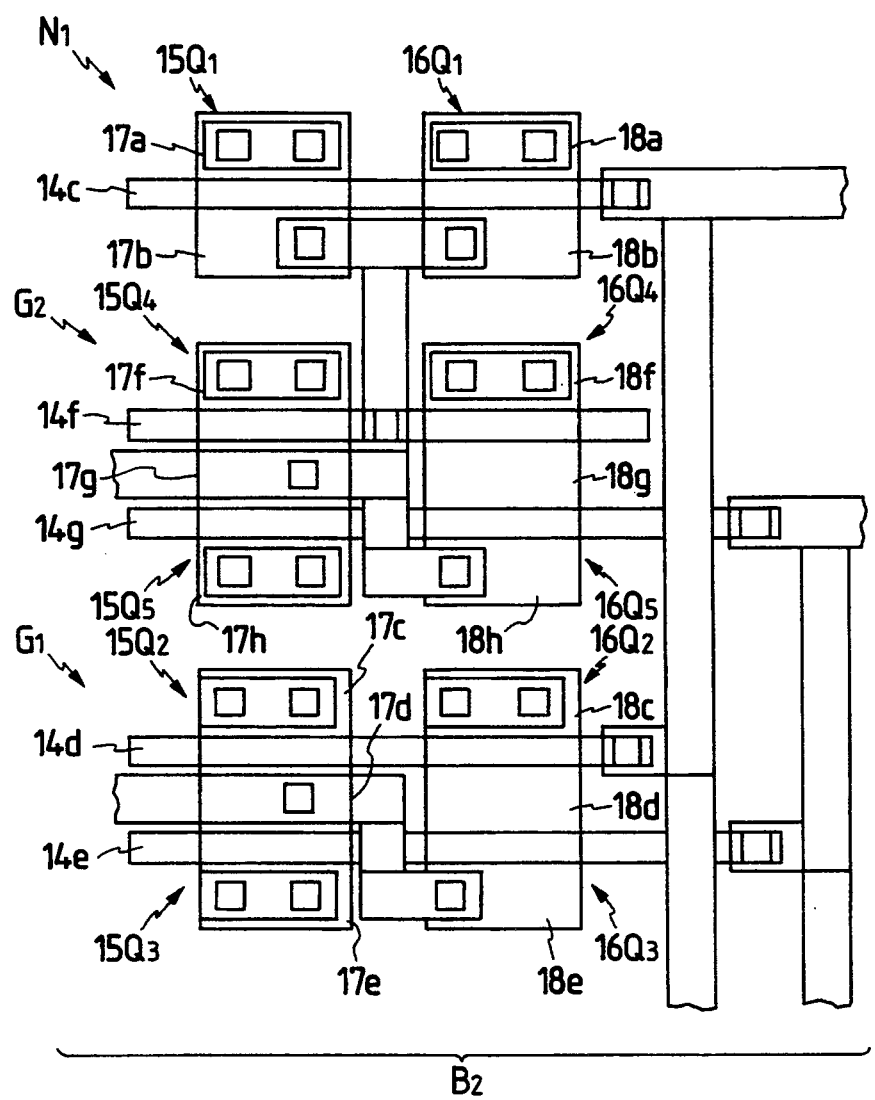
FIG. 6 is an enlarged top plan view showing an essential portion of FIG. 4.
Figure 7:
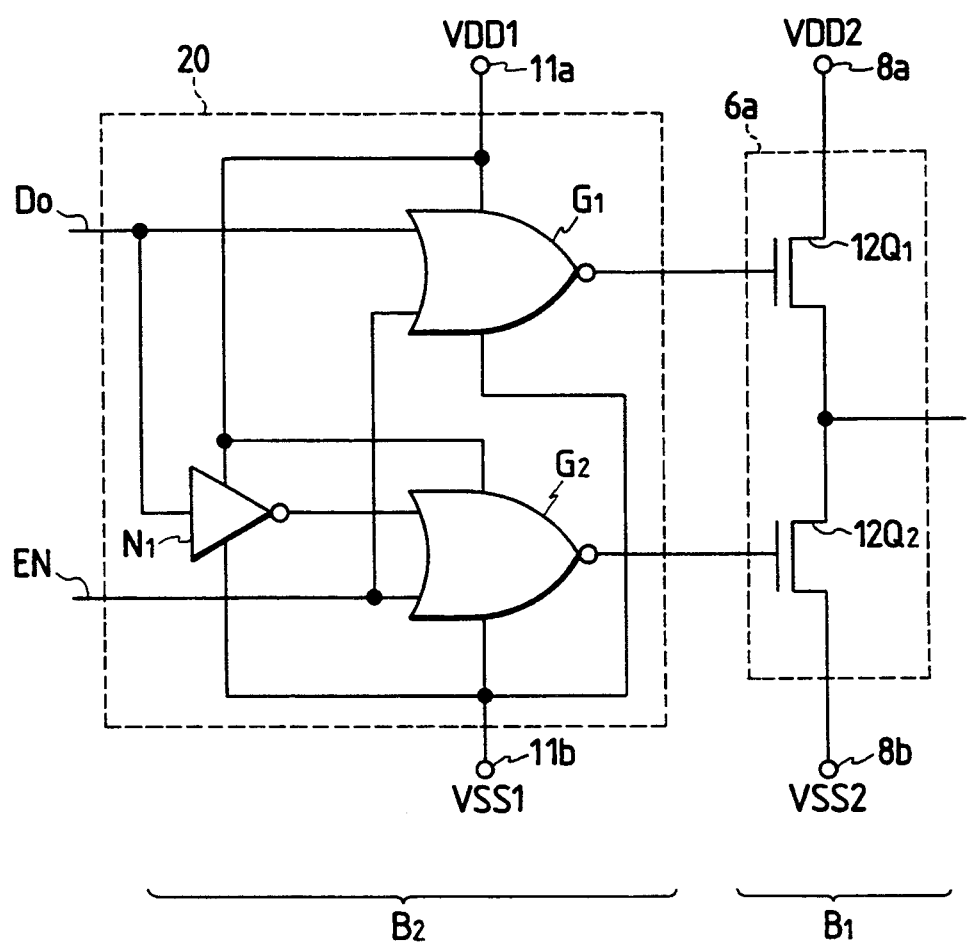
FIG. 7 is a circuit diagram showing a buffer circuit which is formed by using an I/O cell.
Figure 8:
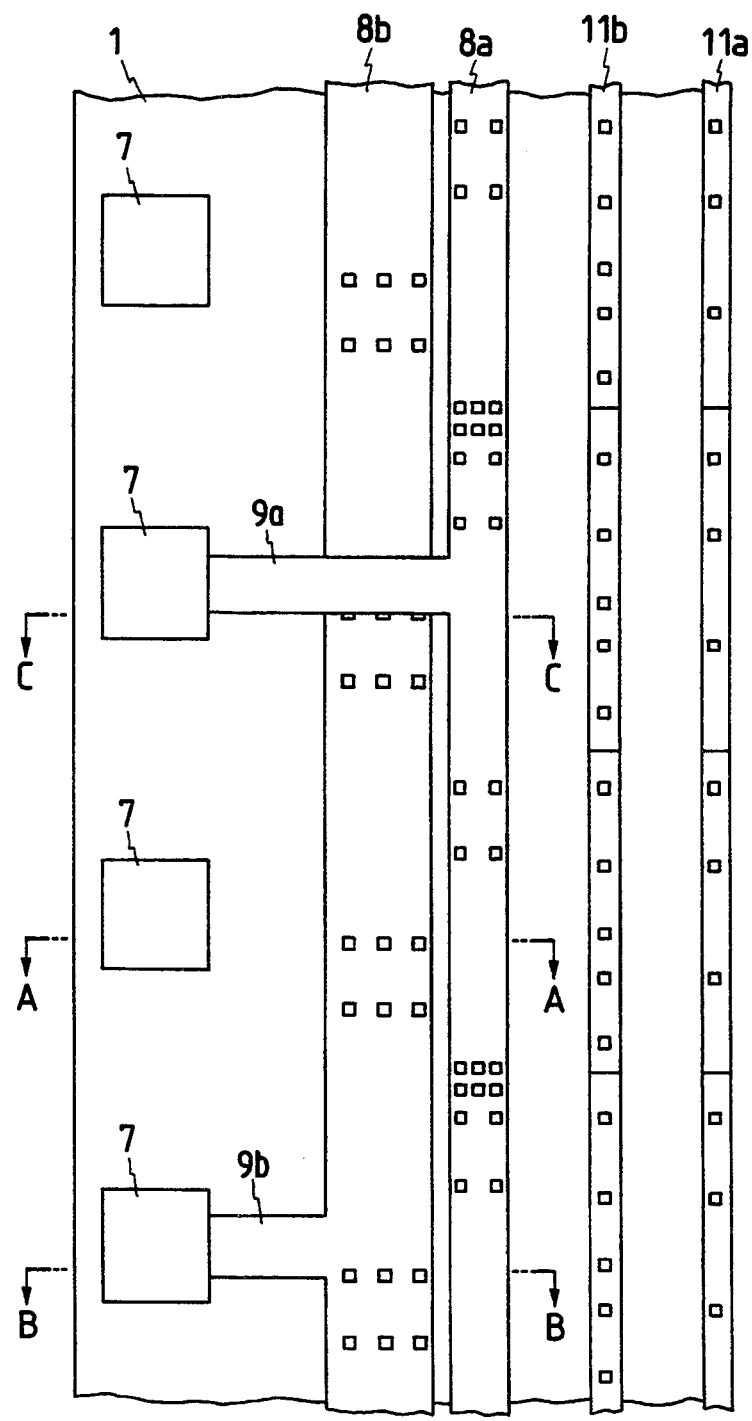
FIG. 8 is an enlarged top plan view showing an essential portion of a semiconductor chip and extracts the wiring lines of a power supply.
Figure 9:
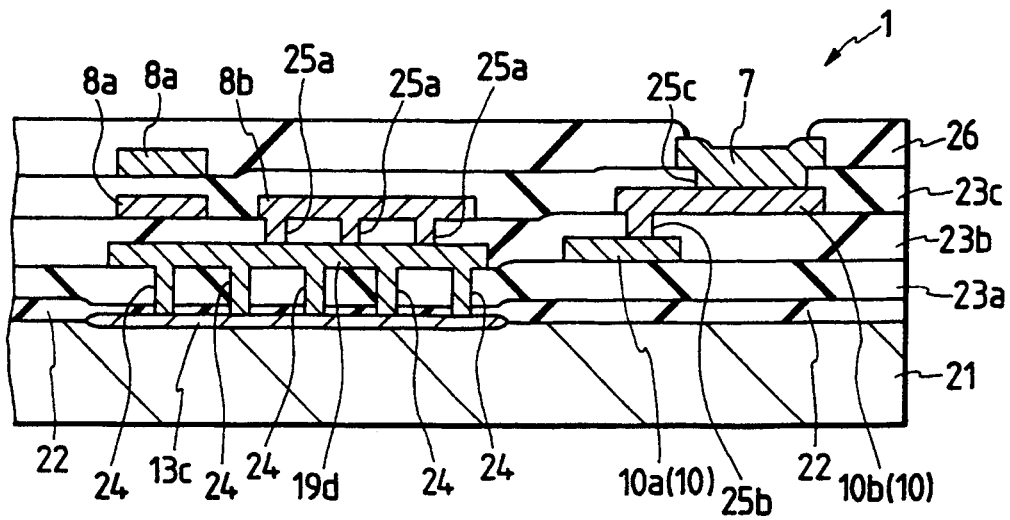
FIG. 9 is a section taken along lines A—A of FIGS. 3 and 8.
Figure 10:
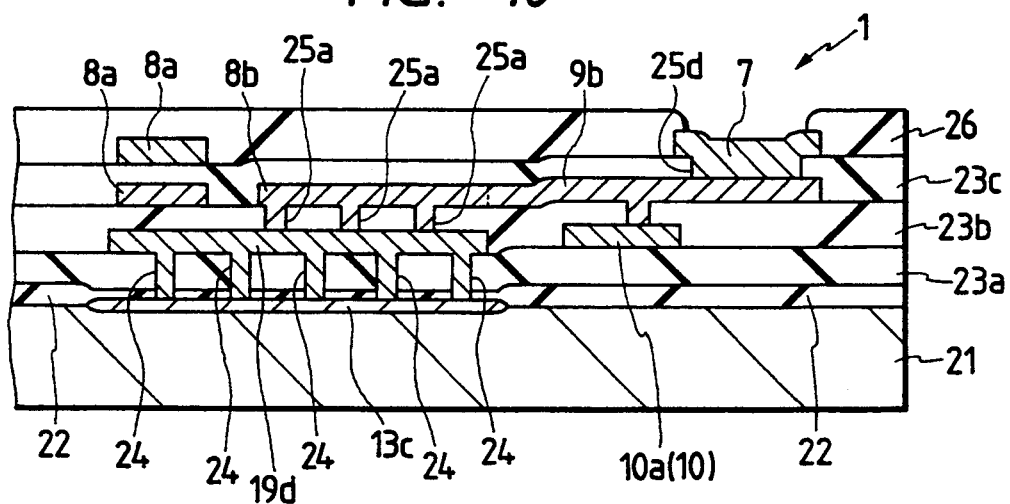
FIG. 10 is a section taken along lines B—B of FIGS. 3 and 8.
Figure 11:
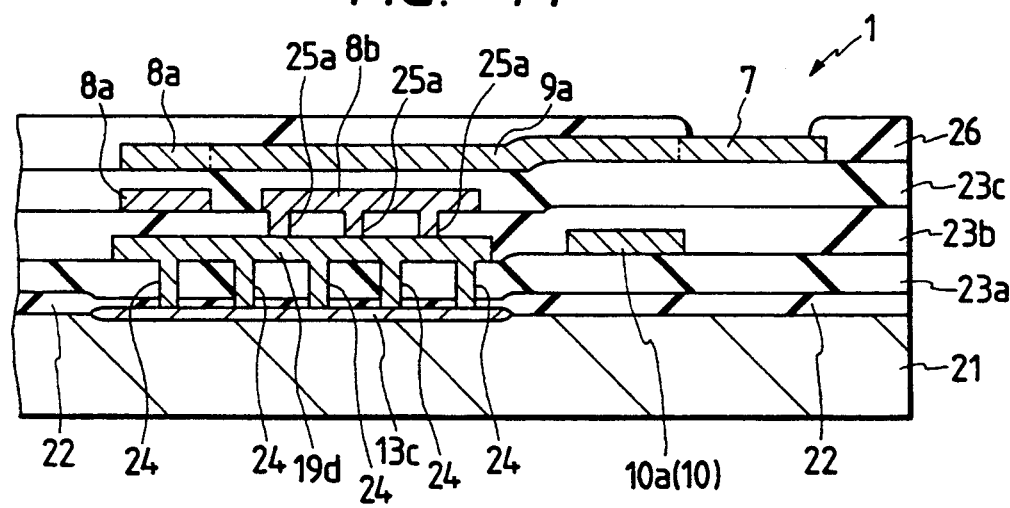
FIG. 11 is a section taken along lines C—C of FIGS. 3 and 8.
Figure 12:
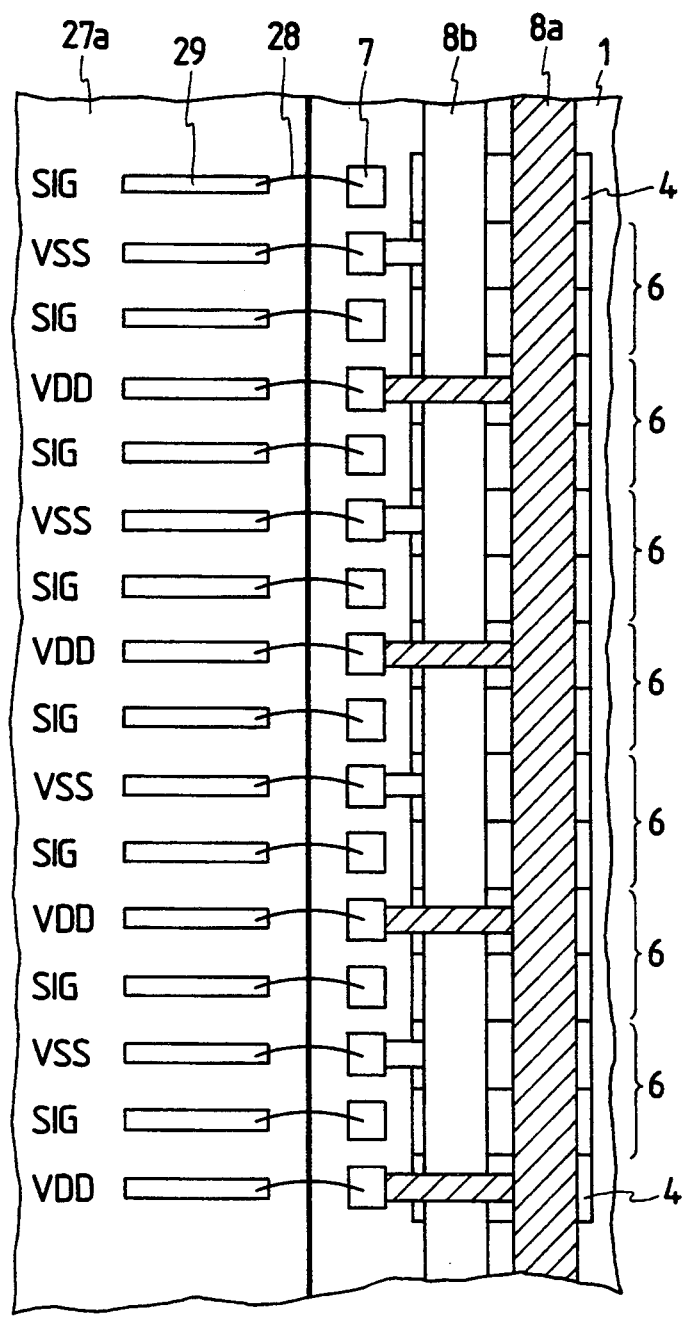
FIG. 12 is an enlarged top plan view of an essential portion of a semiconductor integrated circuit device for explaining the connecting relations between a semiconductor integrated circuit device and a package substrate.
Figure 13:
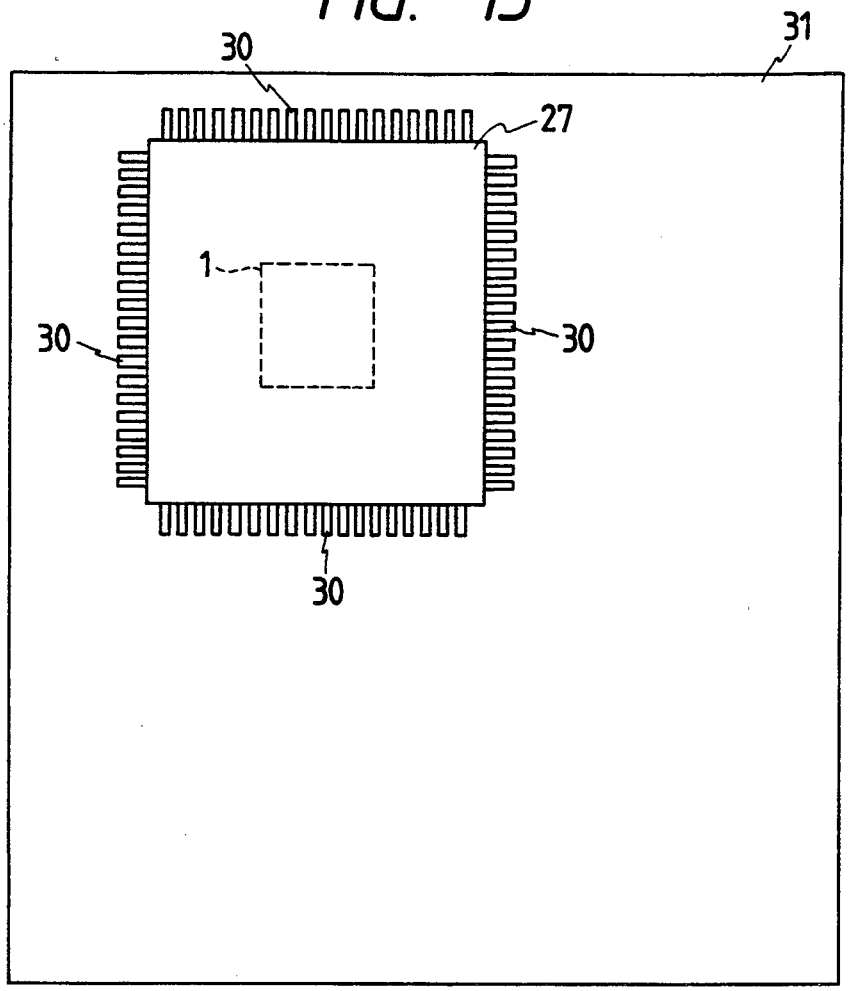
FIG. 13 is an explanatory diagram showing a semiconductor integrated circuit device packaged over a wiring substrate.

FIG. 1 is an overall top plan view showing a semiconductor chip constituting a semiconductor integrated circuit device according to one embodiment of the present invention. FIG. 2 is a enlarged top plan view of an essential portion of a semiconductor chip and schematically shows a high-driving power buffer circuit forming region of the semiconductor integrated circuit device of FIG. 1. FIG. 3 is a enlarged top plan view of an essential portion of a semiconductor chip for explaining the high-driving power buffer circuit forming region in detail. FIG. 4 is an enlarged top plan view showing an essential portion of FIG. 3. FIGS. 5 and 6 are enlarged top plan views showing an essential portion of FIG. 4. FIG. 7 is a circuit diagram showing a buffer circuit which is formed by using an I/O cell. FIG. 8 is an enlarged top plan view showing an essential portion of a semiconductor chip and extracts the wiring lines of a power supply. FIG. 9 is a section taken along lines A—A of FIGS. 3 and 8. FIG. 10 is a section taken along lines B—B of FIGS. 3 and 8. FIG. 11 is a section taken along lines C—C of FIGS. 3 and 8. FIG. 12 is an enlarged top plan view of an essential portion of a semiconductor integrated circuit device for explaining the connecting relations between a semiconductor integrated circuit device and a package substrate. FIG. 13 is an explanatory diagram showing a semiconductor integrated circuit device packaged over a wiring substrate.

The semiconductor integrated circuit device of the present embodiment 1 is a gate array of SOG (Sea Of Gate) type having three metal wiring layers, for example. A semiconductor chip constituting the gate array is shown in top plan view in FIG. 1.

The semiconductor chip 1 is a semiconductor substrate made of a single crystal of silicon (Si), for example, and is arranged at the center of its principal face with an internal circuit region 2. This internal circuit region 2 is arranged with a plurality of basic cells (although not shown) laid all over the surface.

Each of the basic cells is arranged with semiconductor integrated circuit elements such as transistors or resistors which are necessary for constituting a basic gate circuit such as a NAND gate or a NOR gate. The basic gate circuits are electrically connected through lines to form a predetermined logic circuit in the internal circuit region 2. The transistor is exemplified by the CMOSFET (Complementary Metal-Oxide-Semiconductor Field Effect Transistor) or the Bi-CMOS (Bipolar-CMOS).

The internal circuit region 2 is surrounded by a peripheral circuit region 3. This peripheral circuit region 3 is arranged with a plurality of input/output circuits 4 (as will be called merely as the I/O cells) along the outer periphery of the internal circuit region 2. Each of the I/O cells 4 is arranged with semiconductor integrated circuit elements such as transistors necessary for constituting an input/output circuit such as a later-described buffer circuit. The input/output circuit is constructed mainly by connecting the transistors by the first wiring layer, as will be described hereinafter.

The peripheral circuit region 3 is formed with ordinary buffer circuits 5 and high drive power output buffer circuits 6. Each of the ordinary buffer circuits 5 is formed of the semiconductor integrated circuit elements in one I/O cell 4.

The high drive power output buffer circuits 6 are formed of the individual semiconductor integrated circuit elements of the two I/O cells 4. In the present embodiment 1, the high drive power output buffer circuits 6 are arranged continuously in plurality.

Each of the high drive power output buffer circuits 6 can generate a driving power about twice as high as that of each of the ordinary buffer circuits 5. Although not generally specified because of difference of the products, the drive current for the ordinary buffer circuits 5 is about 8 mA, and the drive current of the high drive power output buffer circuits 6 is about 16 mA.

Outside of the I/O cells 4, there are arranged bonding pads (i.e., external terminals) 7. These bonding pads 7 are terminals for leading out the electrodes of the circuits in the semiconductor chip 1 to the outside and are assigned one by one to the individual I/O cells 4. Incidentally, the bonding pads 7 are formed mainly of second- and third-layerd wires and made of aluminum (Al) or an Al alloy. The bonding pads 7 are given a size of about 60×60 μm and a spacing of about 90 μm between the adjacent bonding pads 7 and 7.

Outside of the internal circuit region 2, on the other hand, there are arranged above the I/O cells 4 two peripheral power supply lines 8a and 8b which are extended along the outer periphery of the internal circuit region 2. In FIG. 1, the peripheral power supply lines 8a and 8b are hatched for easy recognition.

The peripheral power supply lines 8a and 8b are wiring lines for supplying the supply voltage to the circuits in the semiconductor chip 1. The peripheral power supply line 8a closer to the internal circuit region 2 is a wiring line for supplying a (high) potential $V_{DD}$ of about 5 V, and the peripheral power supply line 8b adjacent to the former but positioned outside is a wiring line for supplying a (reference) potential $V_{SS}$ of about 0 V.

The peripheral power supply lines 8a and 8b are electrically connected individually with the bonding pads 7 through power leading lines 9a and 9b. As will be detailed with reference to FIG. 3 and FIGS. 9 to 11, the peripheral power supply line 8a is formed of the second and third wiring layers, and the peripheral power supply line 8b is formed of the second wiring layer. The power leading lines 9a and 9b are formed of the third wiring layer and the second wiring layer, respectively. As a result, the individual potentials can be supplied from the bonding pads 7 to the peripheral power supply lines 8a and 8b to supplement the power supply of the peripheral power supply lines 8a and 8b. As a result, the power supply noise can be reduced, and the time periods for rising and breaking the signals can be shortened to improve the operating speed of the gate array.

The power leading lines 9a and 9b are dispersed and arranged in pairs and in a plurality of positions so as to equalize substantially the potentials of the individual positions of the peripheral power supply lines 8a and 8b. In the regions where the plurality of high drive power output buffer circuits 6 are continuously formed, however, the plurality of power leading lines 9a and 9b are arranged in a condensed state for suppressing the high potential fluctuations of the peripheral power supply lines 8a and 8b. Incidentally, the power leading lines 9a and 9b is given a width of about 50 to 80 μm.

FIG. 2 is a diagram schematically showing the region in which the plurality of high drive power output buffer circuits 6 are continuously formed. Incidentally, the peripheral power supply line 8a and the power leading line 9a formed of the third wiring layer are also hatched in FIG. 2 so as to facilitate their recognition.

The high drive power output buffer circuits 6 are formed of two inverter circuits 6a and 6a connected in parallel, for example, and have their outputs connected electrically with the bonding pads 7a through signal leading lines 10 (formed of the first wiring layer). The bonding pad 7a is a terminal which is assigned to one of the two I/O cells 4 constituting each of the high drive power output buffer circuits 6.

On the other hand, the bonding pad 7b assigned to the other I/O cell 4 constituting each of the high drive power output buffer circuits 6 is used as a terminal for supplying the potential to the peripheral power supply line 8a or the peripheral power supply line 8b. In other words, the bonding pads 7 are effectively utilized to suppress the potential fluctuations of the peripheral power supply lines without sacrificing the I/O cells.

By setting the ratio of the power leading lines 9a and 9b to the signal leading lines 10 at 1:1, as shown in FIG. 2, the potential fluctuations of the peripheral power supply lines 8a and 8b, which might otherwise occur at the time of driving the high drive power output buffer circuits 6, can be suppressed more effectively to reduce the power supply noise drastically.

Moreover, the power leading lines 9a and 9b are arranged to interpose the signal leading lines 10. As a result, the following first and second effects can be achieved.

Firstly, the signal leading lines 10 are shielded by the power leading lines 9a and 9b so that the cross talk between the adjacent signal leading lines 10 can be suppressed.

Secondly, the mutual inductance between the power leading lines 9a and 9b and the signal leading lines 10 is augmented so that the effective inductance of the signal leading lines 10 can be reduced to effect a quick signal transmission.

Moreover, the bonding pad 7b assigned to the input-/output circuit 4a (as will be shortly called the I/O cell) adjacent to the terminal of one group of the high drive power output buffer circuits 6 is used as a terminal for supplying $V_{DD}$ potential to improve the above-specified first and second effects.

Next, the semiconductor integrated circuit device according to the present embodiment 1 will be described in more detail with reference to FIGS. 3 to 13. FIG. 3 is an enlarged top plan view showing an essential portion for explaining FIG. 2 in detail.

Each of the I/O cells 4 is arranged with a final stage buffer circuit region $B_1$ and a pre-buffer circuit region $B_2$. The final stage buffer circuit region $B_1$ is formed with the aforementioned inverter circuit 6a (as shown in FIG. 2). The peripheral power supply lines 8a and 8b are arranged over the final stage buffer circuit region $B_1$, and the inverter circuit 6a is supplied with the supply voltage from the peripheral power supply lines 8a and 8b.

On the other hand, the pre-buffer circuit region $B_2$ is formed with a later-described pre-buffer circuit for controlling the drive of the inverter circuit 6a. The pre-buffer circuit region $B_2$ is arranged thereover with power supply lines 11a and 11b and is supplied with the supply voltage from the supply wires 11a and 11b. Specifically, the supply line 11a is supplied with a potential (VDD1) of about 5 V, for example, and the supply line 11b is supplied with a reference potential (VSS1) of about 0 V, for example.

FIG. 4 is an enlarged top plan view showing the two I/O cells 4 of FIG. 3. Moreover, FIGS. 5 and 6 are an enlarged top plan view showing an essential portion of the final stage buffer circuit region $B_1$ and an enlarged top plan view of the pre-buffer circuit region $B_2$. Incidentally, the peripheral power supply lines 8a and 8b and the power lines 11a and 11b are eliminated from FIGS. 4 to 6 so as to facilitate the recognitions.

There are also omitted the substrate power supply, the well power supply and the regions implanted with impurities which are necessary for constituting MOS transistors.

The final stage buffer circuit region $B_1$ is arranged with n-channel MOS (as will be shortly expressed as nMOS)-FETs $12Q_1$ and $12Q_2$. On the other hand, the pre-buffer circuit region $B_2$ is arranged with one inverter circuit $N_1$ and two NOR gates $G_1$ and $G_2$.

The nMOS-FET $12Q_1$ is formed with diffusion layers 13a and 13b and a gate electrode 14a, as shown in FIG. 5. On the other hand, the nMOS-FET $12Q_2$ is formed with diffusion layers 13c and 13d and a gate electrode 14b. Incidentally, the gate electrodes 14a and 14b are made of doped poly-silicon, for example. The gate length is about 0.8 μm, for example.

As shown in FIG. 6, on the other hand, the inverter circuit $N_1$ is constructed of a CMOS circuit including an nMOS·FET $15Q_1$ and a p-channel MOS (as will be expressed as pMOS)·FET $16Q_1$. The nMOS·FET $15Q_1$ is formed with diffusion layers 17a and 17b and a gate electrode 14c. The pMOS·FET $16Q_1$ is formed with diffusion layers 18a and 18b and a gate electrode 14c.

The NOR gate $G_1$ is constructed to include two nMOS·FETs $15Q_2$ and $15Q_3$ and two pMOS·FETs $16Q_2$ and $16Q_3$. The nMOS·FET $15Q_2$ is formed with diffusion layers 17c and 17d and a gate electrode 14d. The nMOS·FET $15Q_3$ is formed with diffusion layers 17d and 17e and a gate electrode 14e. The pMOS·FET $16Q_2$ is formed with diffusion layers 18c and 18d and a gate electrode 14d. The pMOS·FET $16Q_3$ is formed with diffusion layers 18d and 18e and a gate electrode 14e.

On the other hand, the NOR gate $G_2$ is constructed to include two nMOS·FETs $15Q_4$ and $15Q_5$ and two pMOS·FETs $16Q_4$ and $16Q_5$. The nMOS·FET $15Q_4$ is formed with diffusion layers 17f and 17g and a gate electrode 14f. The nMOS·FET $15Q_5$ is formed with diffusion layers 17g and 17h and a gate electrode 14g. The pMOS·FET $16Q_4$ is formed with diffusion layers 18f and 18g and a gate electrode 14g. The pMOS·FET $16Q_5$ is formed with diffusion layers 18g and 18h and a gate electrode 14g.

Here will be described the wiring connections of the nMOS·FETs $12Q_1$ and $12Q_2$ and the inverter circuit $N_1$ and the NOR gates $G_1$ and $G_2$ with reference to FIGS. 4 and 7.

A wiring line $D_o$ is electrically connected with the gate electrode 14c of the input of the inverter circuit $N_1$ and the gate electrode 14d of the input of the NOR gate $G_1$. On the other hand, a wiring line EN is electrically connected with the gate electrodes 14e and 14g of the inputs of the NOR gates $G_1$ and $G_2$.

The inverter circuit $N_1$ has its output electrically connected through a first wiring layer 19a with the input gate electrode 14f of the NOR gate $G_2$. Thus, a pre-buffer circuit 20 is formed.

The NOR gate $G_1$ has its output electrically connected through a first wiring layer 19b with the nMOS·FET $12Q_1$. On the other hand, the NOR gate $G_2$ has its output electrically connected through a first wiring layer 19c with the gate electrode 14b of the input of the nMOS·FET $12Q_2$.

The nMOS·FETs $12Q_1$ and $12Q_2$ have their outputs electrically connected with the signal leading lines 10. The nMOS·FETs $12Q_1$ and $12Q_2$ are connected in series between the peripheral power supply lines 8a and 8b to form the inverter circuit 6a.

Next, the arrangement of the peripheral power supply lines 8a and 8b in the thickness direction of the semiconductor chip 1 will be described with reference to FIG. 3, FIG. 8 and FIGS. 9 to 11. Incidentally, FIG. 8 show the peripheral power supply lines 8a and 8b and the supply lines 11a and 11b led out exclusively.

FIG. 9 is a section taken along line A—A of FIGS. 3 and 8. In a semiconductor substrate 21 constituting the semiconductor chip 1, the element forming region enclosed by a field insulating film 22 is formed with the aforementioned diffusion layer 13c.

On the semiconductor substrate 21, on the other hand, there is deposited by the CVD (Chemical Vapor Deposition) method an insulating film 23a which is made of silicon oxide ($SiO_2$). This insulating film 23a is formed thereover with a first wiring layer (of a first wiring layer) 19d and the signal leading line 10a constituting the aforementioned signal leading lines 10.

The first wiring layer 19d is electrically connected through contact holes 24 with the diffusion layer 13c. Incidentally, the first wiring layer 19d and the signal leading line 10a are made of Al or an Al alloy.

On the insulating film 23a, there is deposited an insulating film 23b for coating the first wiring layer 19d and the signal leading wire 10a. This insulating film 23b is formed thereover with the peripheral power supply lines 8a and 8b (of a second wiring layer) and a signal leading wire 10b constituting the signal leading lines 10. The insulating film 23b is formed of a silicon oxide film which is prepared by the CVD method, for example.

The peripheral power supply line 8b is electrically connected through through holes 25a with the first wiring layer 19d. The peripheral power supply line 8b is given a width larger than that of the peripheral power supply line 8a adjacent to the former, for example, about two times as large as that of the peripheral power supply line 8a, for the later-described reasons.

The signal leading wire 10b is electrically connected through through holes 25b with the signal leading wire 10a of the first wiring layer. Incidentally, the signal leading wire 10b is made of Al or an Al alloy, for example.

On the insulating film 23b, there is deposited an insulating film 23c for coating the peripheral power supply lines 8a and 8b and the signal leading wire 10b. The insulating film 23c is formed thereover with the peripheral power supply line 8a of the third wiring layer and the bonding pads 7. The insulating film 23c is formed of a silicon oxide film which is prepared by the CVD method, for example.

The peripheral power supply line 8a of the third wiring layer is extended in parallel with the peripheral power supply line 8a of the second wiring layer and is electrically connected through not-shown through holes with the peripheral power supply line 8a of the second wiring layer. Incidentally, the peripheral power supply line 8a of the third wiring layer is given the same width as that of the peripheral power supply line 8a of the second wiring layer.

The third wiring layer is the wire leading layer of the peripheral power supply line 8a. The first wiring layer is formed outside of the peripheral power supply line 8a with a wiring inhibition region for inhibiting the arrangement of the other peripheral power supply line 8b.

In other words, the third wiring layer is not formed with the peripheral power supply line 8b, and the outer peripheral power supply line 8b is arranged in such a state that one more layer is reduced from the used wiring layers than the inner peripheral power supply line 8a.

As a result, as shown in FIGS. 10 to 11, the inner peripheral power supply line 8a can be led out from any position of the surface of the semiconductor chip 1 with respect to the bonding pads 7 without using the first layer wire constituting the input/output circuit. As a result, the power supply for the inner peripheral power supply line 8a can be intensified without sacrificing the I/O cells 4.

Then, the sectional area of the peripheral power supply line 8b is smaller than that of the peripheral power supply line 8a to such an extent that the used wiring layers is less than those of the peripheral power supply line 8a. This may cause the problem of the electromigration of the Al or the Al alloy or the power supply noise in the peripheral power supply line 8b. In order to suppress that problem thereby to retain the reliability of the semiconductor integrated circuit device, the width of the peripheral power supply line 8b is made larger than that of the peripheral power supply line 8a, as described above. The reason for making the width of the peripheral power supply line 8b as twice as that of the peripheral power supply line 8a comes from the fact that the used wiring layers of the peripheral power supply line 8a is twice as many as those of the peripheral power supply line 8b.

On the insulating film 23c, there is deposited a surface protecting film 26 for coating the peripheral power supply line 8a and the bonding pads 7 partially. These bonding pads 7 are electrically connected through through holes 25c with the signal leading wire 10b.

FIG. 10 is a section taken along line B—B of FIGS. 3 and 8. The peripheral power supply line 8b is electrically connected with the bonding pads 7 through the power leading line 9b which is made integral with the same wiring layer as the peripheral power supply line 8b.

As a result, the power supply potential can be supplied from the bonding pads 7 to the peripheral power supply line 8b from any position of the semiconductor chip 1 thereby to intensify the power supply of the peripheral power supply line 8b. Incidentally, the power leading line 9b is electrically connected through through holes 25d with the bonding pads 7.

FIG. 11 is a section taken along line C—C of FIGS. 3 and 8. The peripheral power supply line 8a of the third wiring layer is electrically connected with the bonding pads 7 without changing the wiring layers through the power leading line 9a which is made integral with the same wiring layer of the peripheral power supply line As a result, the supply potential can be supplied from the bonding pads 7 to the peripheral power supply line 8a thereby to intensify the power supply of the peripheral power supply line 8a.

Thus, the outermost peripheral power supply line 8b is arranged to have its used wiring layers less by one than those of the inner peripheral power supply line 8a, and the wiring layers thus reduced are formed with the power leading line 9a for connecting the inner peripheral power supply line 8a and the bonding pads 7. As a result, the inner peripheral power supply line 8a can be equipped with the power leading line 9a from any position on the semiconductor chip 1 with respect to the bonding pads 7.

As a result, the power supplies of the of the peripheral power supply lines 8a and 8b can be intensified without sacrificing the I/O cells 4. Thus, it is possible to reduce the power supply noise without inviting any increase in the chip size and to shorten the time period for raising and breaking the signal thereby to improve the operating speed of the gate array.

Without any change in the connection of the second wiring layer of the first layer for forming the input/output circuits, moreover, the power supplies of the peripheral power supply lines 8a and 8b can be intensified merely by providing the power leading lines 9a and 9b so that the operating speed can be improved without deteriorating the degree of freedom for the design.

In other words, the first wiring layer for connecting the transistors constituting the input/output circuits or the high drive power output buffer circuits is constructed to connect the peripheral power supply lines 8a and 8b and the bonding pads 7 by using other wiring layers (e.g., the second and third wiring layers). Here, the bonding pads 7 and the peripheral power supply lines 8a and 8b have at least one wiring layer shared inbetween.

Next, the relation between the semiconductor chip 1 and the package substrate for packaging the former will be described with reference to FIGS. 12 and 13. Incidentally, the semiconductor chip 1 of FIG. 12 indicates the dense region of the high drive power output buffer circuits 6. In FIG. 12, too, the peripheral power supply line 8a is hatched for easy recognition.

The semiconductor chip 1 is adhered onto a package substrate 27a by means of an adhesive, as shown in FIG. 12. The bonding pads 7 of the semiconductor chip 1 are electrically connected through bonding wires 28 with bonding pads 29 overlying the package substrate 27a.

The bonding pads 29 of the package substrate 27a are arranged such that the bonding pads 29 for the signals of the high drive power output buffer circuits are sandwiched between the bonding pads 29 and 29 for the supply potentials $V_{SS}$ and $V_{DD}$.

The bonding pads 29 are electrically connected through not-shown wires with outer leads 30 which are projected from the four sides of the package 27 shown in FIG. 13. Of these wires, the signal wires connected with the bonding pads 29 for the signals of the high drive power output buffer circuits 6 are sandwiched between the two power supply lines $V_{DD}$ and $V_{SS}$.

In the package 27, too, the coupling between the adjacent signal wires can be suppressed to suppress the cross-talk inbetween, and the effective inductance of the signal wires can be reduced as a result of the increase in the mutual inductance between the power wires and the signal wires.

The package 27, as shown in FIG. 13, is exemplified by the facial type package such as the QFP (Quad Flat Package). The package 27 is mounted over a printed circuit substrate 31 by soldering outer leads 30 protruded from its four sides, to the (not-shown) land formed on the printed circuit substrate.

Thus, the following effects can be achieved according to the present embodiment 1.

(1) The wiring layers used in the outermost peripheral power supply line 8b are less by one than the wiring layers used in the inner adjacent peripheral power supply line 8a, and the power leading line for connecting the peripheral power supply line 8a and the bonding pads is formed in the reduced wiring layers. As a result, the inner peripheral power supply line 8a can be led out from any bonding pad 7 on the semiconductor chip 1 without using the first wiring layer constituting the input/output circuit.

(2) Thanks to the aforementioned effect (1), the supply potential can be fed to the inner peripheral power supply line 8a without sacrificing the I/O cells 4 thereby to intensify the power supply of the peripheral power supply line 8a.

(3) Thanks to the aforementioned effect (1), the supply potential can be fed to both the peripheral power supply lines 8a and 8b from the bonding pads 7 near the high drive power output buffer circuits 6.

(4) Thanks to the aforementioned effect (3), the potential fluctuations of the peripheral power supply lines 8a and 8b, which are caused at the time of driving the high drive power output buffer circuits 6, can be suppressed to reduce the power supply noise more than the prior art.

(5) Thanks to the aforementioned effect (3), the time periods for raising and breaking the signals of the high drive power output buffer circuits 6 can be shortened to improve the operating speed of the gate array.

(6) The ratio of the signal leading lines 10 of the high drive power output buffer circuits 6 to the power leading lines 9a and 9b from the peripheral power supply lines 8a and 8b is set at 1:1 so that the potential fluctuations of the peripheral power supply lines 8a and 8b, which are caused at the time of driving the high drive power output buffer circuits 6, can be effectively suppressed to reduce the power supply noise drastically.

(7) Thanks to the aforementioned effect (1), the bonding pads 7, which are assigned to the I/O cells 4 constituting the high drive power output buffer circuits 6 but are useless in the prior art, can be used as the terminals for the power supply. As a result, the bonding pads 7 can be effectively used, and the power supply to the peripheral power supply lines 8a and 8b can be reinforced without inviting any increase in the chip size.

(8) The coupling between the adjacent signal leading lines 10 of the high drive power output buffer circuits 6 can be suppressed by sandwiching the signal leading lines 10 between the power leading lines 9a and 9b led out from the peripheral power supply lines 8a and 8b, thereby to suppress the cross-talk between the adjacent signal leading lines 10 and 10.

(9) The mutual inductance between the power leading lines 9a and 9b and the signal leading lines 10 is increased by sandwiching the signal leading lines 10 between the power leading lines 9a and 9b led out from the peripheral power supply lines 8a and 8b, so that the effective inductance of the signal leading lines 10 can be reduced to effect high-speed signal transmissions.

(10) The electromigration in the peripheral power supply line 8b and the occurrence of the power supply noise can be suppressed by making the peripheral power supply line 8b wider than the peripheral power supply line 8a, thereby to retain the reliability of the gate array.

(11) The number of the through holes in case the peripheral power supply line 8a is led out can be made less than that of the prior art, so that the percentage of the electromigration liable to occur in the those through hole portions can be reduced to improve the reliability of the gate array.

FIGS. 14 to 17 are sections showing an essential portion of a semiconductor chip constituting a semiconductor integrated circuit device according to a second embodiment of the present invention.

Here will be described a semiconductor integrated circuit device of the present embodiment 2 with reference to FIGS. 14 to 17 which show cross-sections similar to FIGS. 9 to 11.

In the present embodiment 2, four metal wiring layers are formed, and the semiconductor chip 1 is arranged with signal leading lines 10a to 10c, power leading lines 9a to 9c, peripheral power supply lines 8a to 8c, and bonding pads 7.

Figure 14:
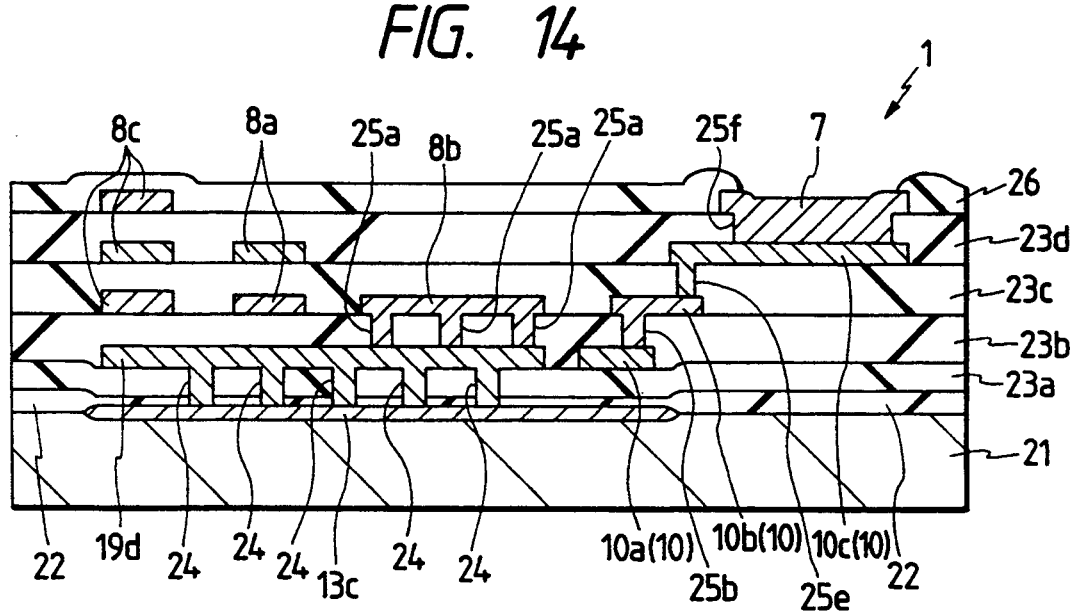
FIG. 14 is a section showing an essential portion of a semiconductor chip constituting a semiconductor integrated circuit device according to a second embodiment of the present invention.

As shown in FIG. 14, the signal leading line 10a of the first wiring layer is electrically connected with the bonding pads 7 of the fourth wiring layer through the signal leading line 10b of the second wiring layer and the signal leading line 10c of the third wiring layer.

Incidentally, the signal leading line 10b is electrically connected with the signal leading line 10c through through holes 25e formed in the insulating film 23c. On the other hand, the signal leading line 10c is electrically connected with the bonding pads 7 through through holes 25f formed in an insulating film 23d.

The peripheral power supply line 8b is formed only in the second wiring layer. This is because the third wiring layer and the fourth wiring layer form the respective wire line leading wiring layers of the peripheral power supply lines 8a and 8c and provide the wiring inhibition region against the peripheral power supply line 8b.

The width of the peripheral power supply line 8b is made about twice as large as that of the peripheral power supply line 8a, for example, as in the foregoing embodiment 1.

Figure 15:
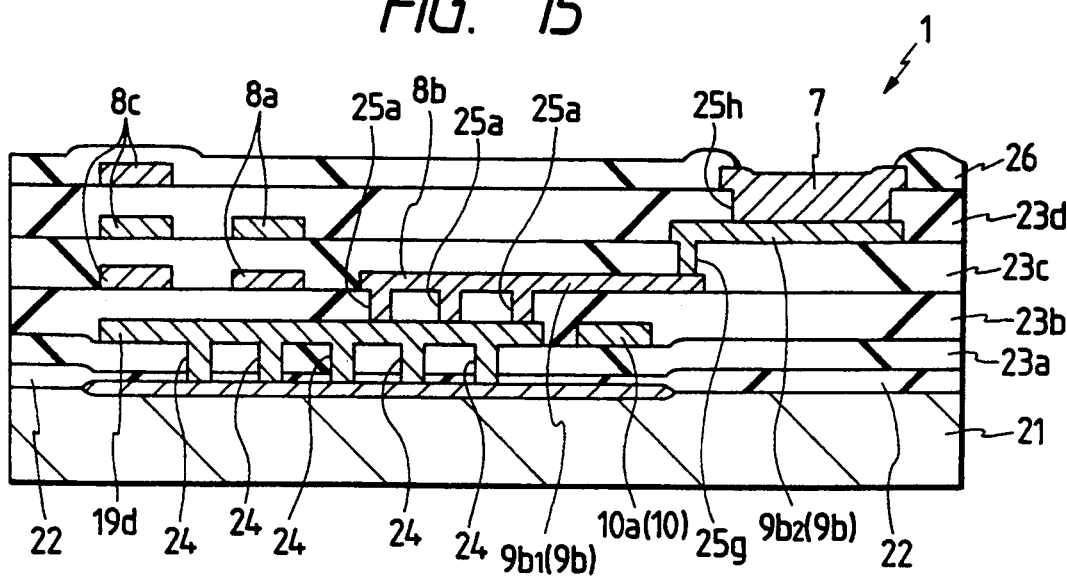
FIG. 15 is a section showing an essential portion of a semiconductor chip constituting a semiconductor integrated circuit device according to another section of the second embodiment of the present invention.

Moreover, the peripheral power supply line 8b is electrically connected, as shown in FIG. 15, with the bonding pads 7 of the fourth wiring layer through a power supply leading line $9b_1$ (or 9b) formed in the second wiring layer integrally with the peripheral power supply line 8b and a power supply leading line $9b_2$ (or 9b) formed in the third wiring layer. As a result, the peripheral power supply line 8b can be fed with the potential $V_{SS}$.

Incidentally, the power supply leading lines $9b_1$ and $9b_2$ are electrically connected with each other through through holes 25g formed in the insulating film 23c. Moreover, the power supply leading line $9b_2$ is electrically connected with the bonding pads 7 through through holes 25h formed in the insulating film 23d.

The peripheral power supply line 8a is formed only in the second wiring layer and the third wiring layer. This is because the fourth wiring layer is the line leading wiring layer of the peripheral power supply line 8c and provides a wiring inhibition region against the peripheral power supply line 8a.

Figure 16:
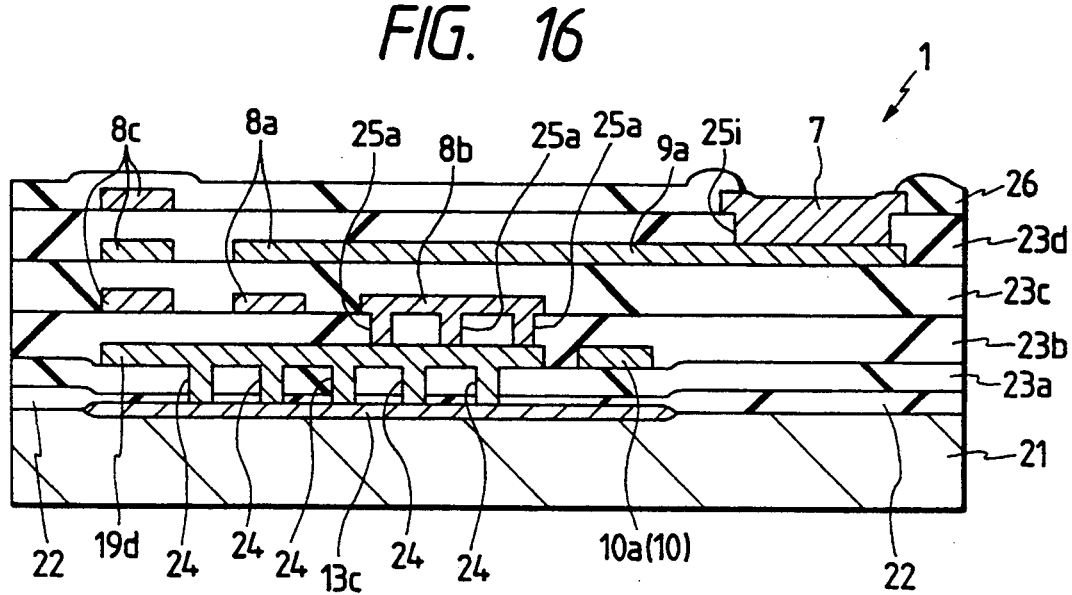
FIG. 16 is a section showing an essential portion of a semiconductor chip constituting a semiconductor integrated circuit device according to another section of the second embodiment of the present invention.

The peripheral power supply line 8a formed in the third wiring layer is electrically connected, as shown in FIG. 16, with the bonding pads 7 of the fourth wiring layer through the power leading line 9a of the third wiring layer. As a result, the potential $V_{DD}$ can be fed to the peripheral power supply line 8a without using the wiring line of the first layer.

Incidentally, the power leading line 9a is electrically connected with the bonding pads 7 through through holes 25i formed in the insulating film 23d.

The innermost peripheral power supply line 8c is a line for feeding a potential of about 3.3 V to the circuit in the semiconductor chip 1 and is formed in the second wiring layer, the third wiring layer and the fourth wiring layer. In other words, there are formed peripheral power supply lines 8a to 8c for feeding the supply potentials of 0 V, 5 V and 3.0 to 3.3 V.

The peripheral power supply lines 8c in the individual wiring layers are made of Al or an Al alloy, for example, and are connected with each other through the not-shown through holes. Incidentally, the peripheral power supply lines 8c are given the same width as that of the peripheral power supply line 8a.

Figure 17:
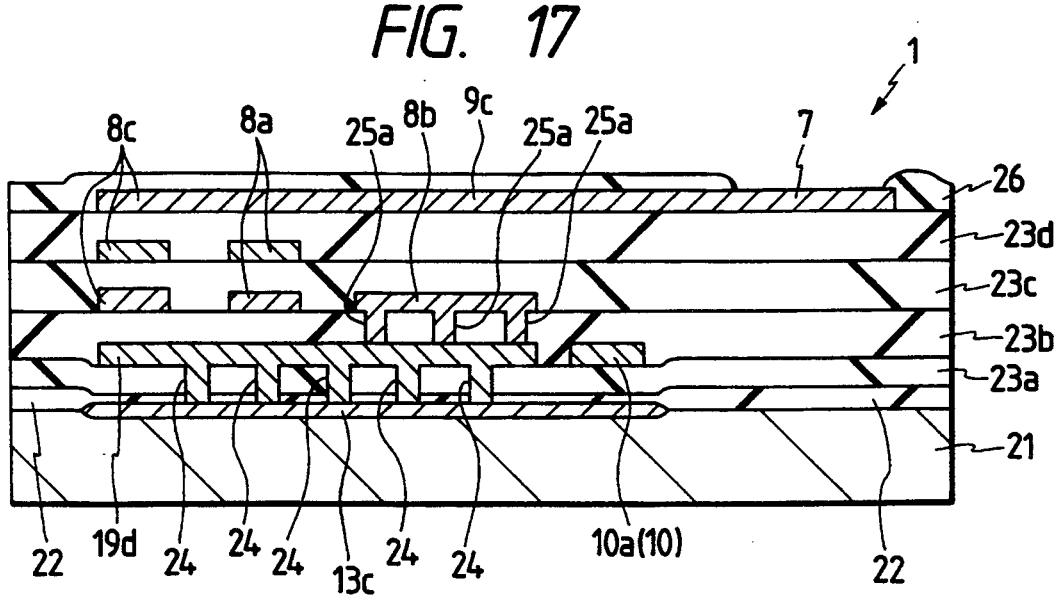
FIG. 17 is a section showing an essential portion of a semiconductor chip constituting a semiconductor integrated circuit device according to another embodiment of the present invention.

The peripheral power supply lines 8c are electrically connected, as shown in FIG. 17, with the bonding pads 7 of the fourth wiring layer through the power leading lines 99c formed in the fourth wiring layer integrally with the peripheral power supply lines 8c. As a result, the power supply potential can also be fed to the peripheral power supply lines 8c without using the first layer lines.

Thus, effects similar to those of the foregoing embodiment 1 can also be achieved in the present embodiment 2.

Figure 18:
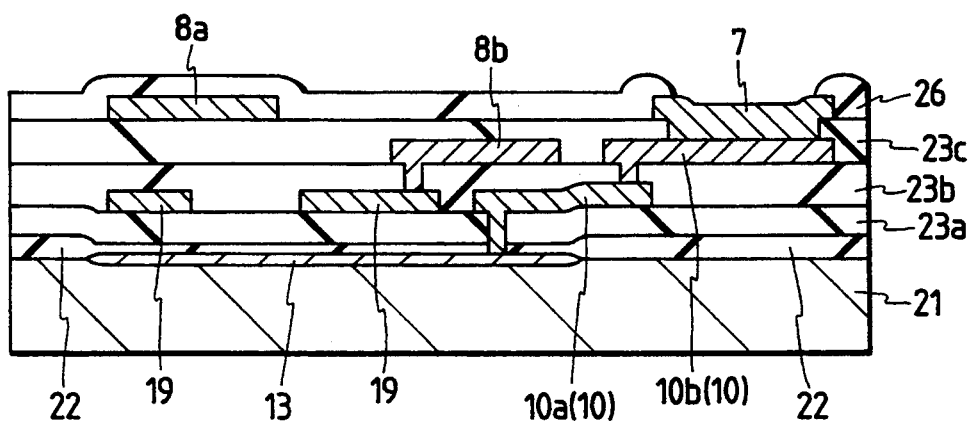
FIG. 18 is a section showing an essential portion of a semiconductor chip constituting a semiconductor integrated circuit device according to a third embodiment of the present invention.
Figure 19:
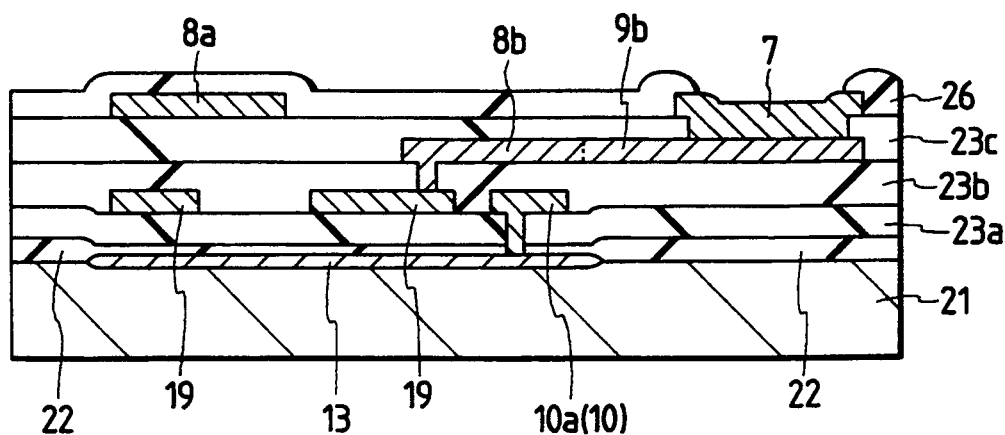
FIG. 19 is a section showing an essential portion of a semiconductor chip constituting a semiconductor integrated circuit device according to another section of the third embodiment of the present invention.
Figure 20:
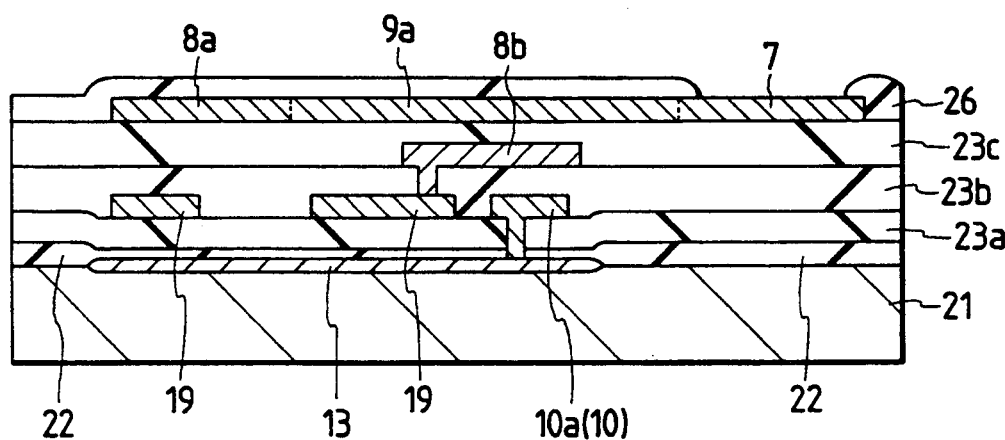
FIG. 20 is a section showing an essential portion of a semiconductor chip constituting a semiconductor integrated circuit device according to another section of the third embodiment of the present invention.

FIGS. 18 to 20 are sections showing an essential portion of a semiconductor chip constituting a semiconductor integrated circuit device according to a third embodiment of the present invention which shows cross-sections similar to FIGS. 9 to 11. In FIGS. 18 and 19, reference numeral 13 designates a diffusion layer, and numeral 19 designates a first layer line.

The semiconductor integrated circuit device of the present embodiment 3 will be described in the following with reference to FIGS. 18 to 20.

In the present embodiment 3, the metal wiring layer is given a construction of three layers, for example. The peripheral power supply line 8b is formed only in the second wiring layer. This is because the third wiring layer is a line leading wiring layer for the peripheral power supply line 8a and a wiring inhibition region for the peripheral power supply line 8b. This peripheral power supply line 8b is electrically connected through the power leading line 9b of the second wiring layer with the bonding pads 7 of the third wiring layer.

In the present embodiment 3, the peripheral power supply line 8a is formed in the third wiring layer. In the present embodiment 3, therefore, the peripheral power supply line 8a is made wider than that of the foregoing embodiment 1 while considering the electromigration and the power supply noise, for example.

The peripheral power supply line 8a is electrically connected, as shown in FIG. 20, with the bonding pads 7 of the third wiring layer through the power leading line 9a which is formed in the third wiring layer integrally with the peripheral power supply line 8a.

As a result, in the present embodiment 3, too, the peripheral power supply lines 8a and 8b can be led out to the bonding pads 7 without using the first layer line, i.e., without sacrificing the I/O cells, thereby to achieve effects similar to those of the foregoing embodiment 1.

Although our invention has been specifically described in connection with the embodiments thereof, it should not be limited to the foregoing embodiments 1 to 3 but can naturally be modified in various manners without departing from the gist thereof.

In the foregoing embodiments 1 to 3, for example, the peripheral power supply line for feeding the potential $V_{SS}$ are arranged outside of the peripheral power supply line for feeding the potential $V_{DD}$. Despite of this description, however, the present invention should not be limited thereto, but the arrangement of the peripheral power supply lines may be reversed.

Figure 21:
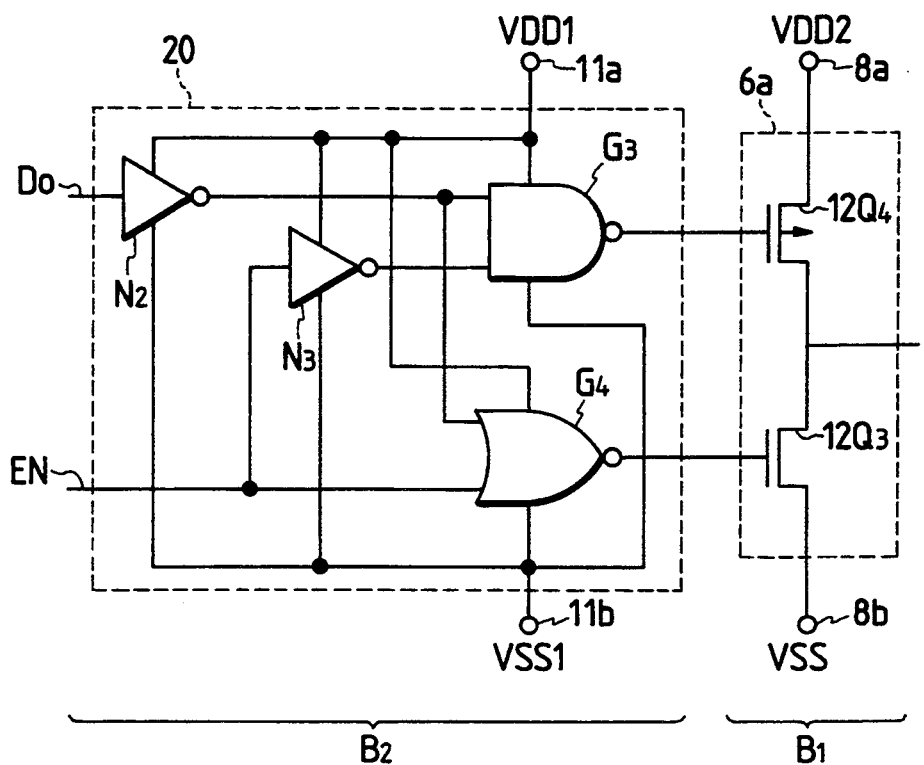
FIG. 21 is a circuit diagram showing a buffer circuit in a semiconductor integrated circuit device of another embodiment of the present invention.

Moreover, the description of the foregoing embodiment 1 is directed to the case in which the inverter circuit constituting the high drive power output buffer circuit is composed exclusively of the nMOS-FETs. Despite of this description, the present invention should not be limited thereto, but the inverter circuit may be constructed of a CMOS circuit composed of an nMOS-FET $12Q_3$ and a pMOS-FET $12Q_4$, for example, as shown in FIG. 21.

In this modification, the pre-buffer circuit 20 has a construction different from that of the foregoing embodiment 1. Specifically, the pre-buffer circuit 20 is constructed to include inverter circuits $N_2$ and $N_3$, an NAND gate $G_3$ and a NOR gate $N_4$.

The wiring line $D_o$ is connected with the input of the inverter circuit $N_2$, and the wiring line EN is connected with the input of the inverter circuit $N_3$ and the input of the NOR gate $G_4$. The output of the inverter circuit $N_2$ is connected with the inputs of the NAND gate $G_3$ and the NOR gate $G_4$.

The output of the inverter circuit $N_3$ is connected with the input of the NAND gate $G_3$. The output of the NAND gate $G_3$ is connected with the input of the pMOS-FET $12Q_4$, and the output of the NOR gate $G_4$ is connected with the input of the nMOS-FET $12Q_3$.

On the other hand, the description of the foregoing embodiment 1 is directed to the case in which the bonding pads are arranged in the third wiring layer. Despite of this description, however, in the semiconductor integrated circuit device having three metal wiring layers, for example, the bonding pads may be formed in the second wiring layer.

Figure 22:
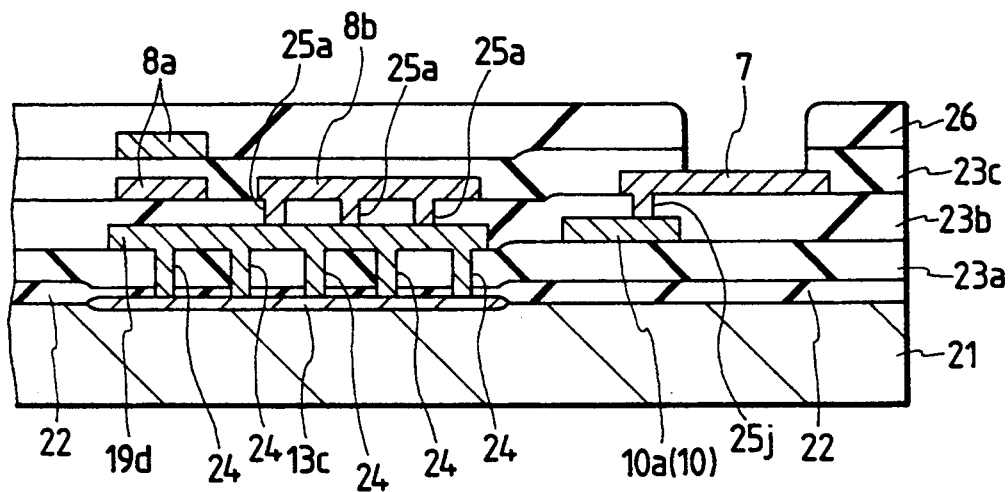
FIG. 22 is a section showing an essential portion of a semiconductor chip constituting a semiconductor integrated circuit device according to a fourth embodiment of the present invention.
Figure 23:
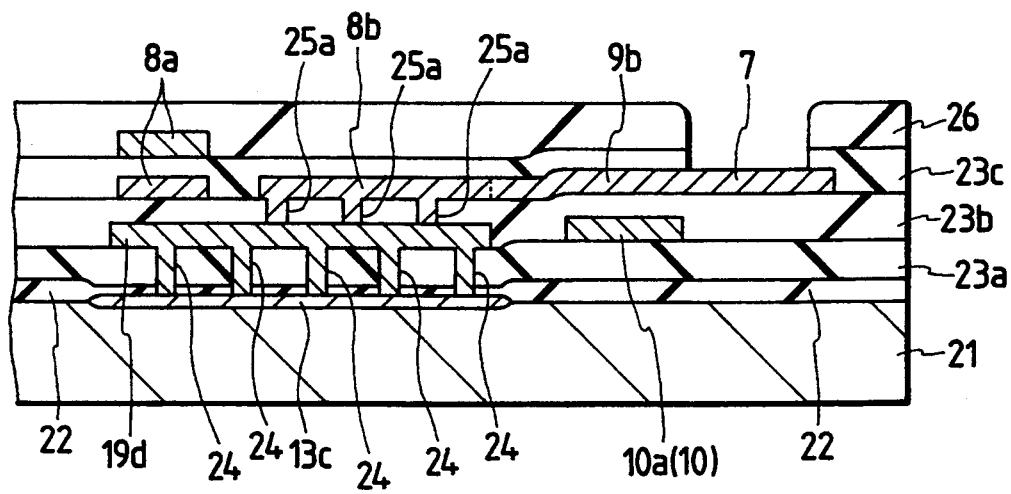
FIG. 23 is a section showing an essential portion of a semiconductor chip constituting a semiconductor integrated circuit device according to another section of the fourth embodiment of the present invention.
Figure 24:
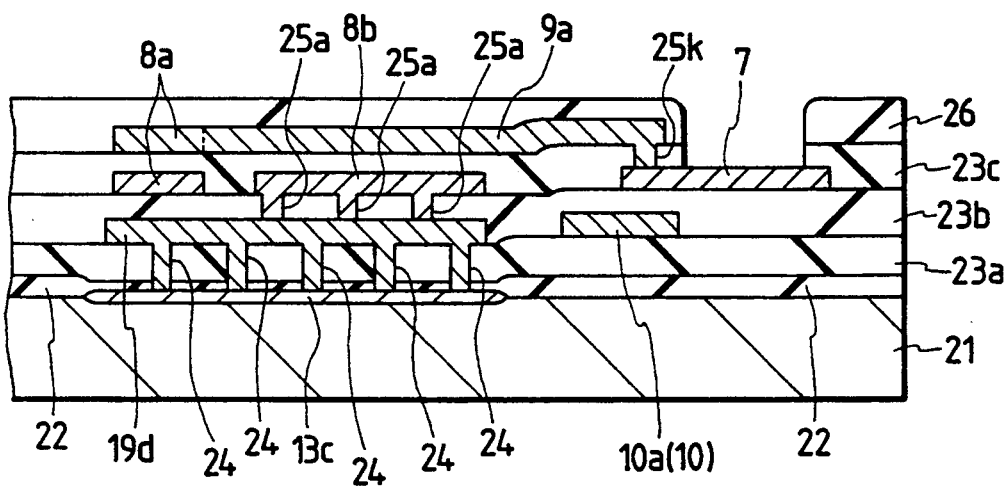
FIG. 24 is a section showing an essential portion of a semiconductor chip constituting a semiconductor integrated circuit device according to another section of the fourth embodiment of the present invention.

This modification is shown in FIGS. 22 to 24 which show cross-sections similar to FIGS. 9 to 11. As shown in FIG. 22, the signal leading line 10a is electrically connected through through holes 25j with the bonding pads 7 of the second wiring layer.

As shown in FIG. 23, the peripheral power supply line 8b of the second wiring layer is electrically with the bonding pads 7 of the second wiring layer through the power leading line 9b which is formed in the second wiring layer integrally with the peripheral power supply line 8b.

As shown in FIG. 24, the peripheral power supply line 8a of the third wiring layer is electrically connected with the bonding pads 7 of the second wiring layer through both the power leading line 9a formed in the third wiring layer integrally with the peripheral power supply line 8a and through holes 25k.

On the other hand, the description of the foregoing embodiment 2 is directed to the case in which only the width of the outermost peripheral power supply line is enlarged. Despite of this description, however, the present invention should not be limited thereto, but the widths of the peripheral power supply lines may be made gradually the larger as they are arranged at the outer sides.

Although our invention has been described mainly in case it is applied to the gate array presenting its background field of application, it should not be limited thereto but can be modified in various manners. For example, our invention can be applied to another semiconductor integrated circuit device such as a standard cell.

On the other hand, the descriptions of the foregoing embodiments 1 to 3 are directed to the case in which the present invention is applied to the SOG type gate array. Despite of this description, however, the present invention should not be limited thereto but can be applied another gate array having a wiring channel region between the columns of the fundamental cells.

On the other hand, the descriptions of the foregoing embodiments 1 to 3 are directed to the case in which the present invention is applied to the semiconductor integrated circuit device which is formed with only the logic circuits in the internal circuit region. Despite of this description, however, the present invention should not be limited thereto but can be applied to a semiconductor integrated circuit device which is formed with both logic circuits and memory circuits, for example, in the internal circuit region.

The effects to be obtained from the representatives of the invention disclosed herein will be briefly described in the following.

(1) The semiconductor integrated circuit device having a plurality of peripheral power supply lines extended along the periphery of the internal circuit region formed in the semiconductor chip is constructed such that the line leading wiring layers are determined for the individual ones of the peripheral power supply lines and are formed with such wiring inhibition regions outside of the peripheral power supply lines arranged in the line leading wiring layers as can inhibit the arrangements of other peripheral power supply lines.

As a result, the inner peripheral power supply line can be led out from any position of the semiconductor chip without using the wiring layers forming the semiconductor integrated circuit or the input/output circuit. Specifically, the individual power potentials $V_{SS}$ and $V_{DD}$ can be fed to their peripheral power supply lines from the external terminals in the vicinity of the high drive power output buffer circuits without sacrificing the I/O cells.

As a result, the potential fluctuations of the peripheral power supply lines, which are caused at the time of driving the high drive power output buffer circuits, can be suppressed to reduce the power supply noise more than the prior art. Moreover, the time periods for raising and breaking the signals of the high drive power output buffer circuits can be shortened to improve the operating speed of the semiconductor integrated circuit device.

(2) The semiconductor integrated circuit device is constructed such that the outermost one of the plurality of peripheral power supply lines is made wider than other peripheral power supply lines.

As a result, the reduction of the wiring section due to the reduction of the usable wiring layers of the outermost peripheral power supply line can be compensated to suppress the migration or the power supply noise in the outermost peripheral power supply line thereby to retain the strength reliability and electric reliability of the outermost peripheral power supply line.

(3) In the structure of the semiconductor integrated circuit device, the plurality of I/O cells are arranged along the periphery of the internal circuit region, and there are arranged the high drive power output buffer circuits which are composed of two more more adjacent ones of the plurality of I/O cells and adapted to be fed with the power voltage from the peripheral power supply lines. The predetermined external terminals, which are assigned to the plurality of I/O cells 4 composing the high drive power output buffer circuits, are used as terminals for feeding the power voltage to the plurality of peripheral power supply lines.

As a result, the external terminals, which are assigned to the I/O cells composing the high drive power output buffer circuits but have been useless in the prior art, can be used as the power supply terminals for the peripheral power supply lines so that they can be effectively exploited to intensify the power source of the peripheral power supply lines without inviting any increase in the chip size.

(4) In the structure of the semiconductor integrated circuit device, the high drive power output buffer circuits are arranged continuously in plurality, and the power leading lines led out from the plurality of peripheral power supply lines to the predetermined external terminals are arranged at the two sides of the signal leading lines which are led out from the high drive power output buffer circuits to the external terminals.

As a result, the signal leading lines are shielded by sandwiching the signal leading lines, which are led out from the high drive power output buffer circuits, between the power leading lines at the reference potential and the power leading lines at a potential higher than the reference potential, so that the coupling between the signal leading lines can be suppressed to suppress the cross-talk between the signal leading lines.

Moreover, the mutual inductance between the signal leading lines and the power leading lines can be increased to reduce the effective inductance of the signal leading lines thereby to effect high speed transmissions of signals.

What is claimed is:

1. A semiconductor integrated circuit device comprising:
    a semiconductor substrate having a main surface including an internal circuit forming region;
    a plurality of peripheral power supply lines so extended on said main surface along the periphery of said internal circuit forming region as to enclose said internal circuit forming region, said peripheral power supply lines including a first peripheral power supply line arranged in the outermost periphery of said internal circuit forming region and a second peripheral power supply line positioned internally of and adjacent to said first peripheral power supply line;
    a plurality of external terminals disposed on said main surface and outside of said peripheral power supply lines;
    a first inter-layer insulating film so formed on said main surface as to cover said main surface and said first peripheral power supply line, said second peripheral power supply line being formed on said first inter-layer insulating film; and
    a first power leading line formed on said first inter-layer insulating film and over said first peripheral power supply line and electrically connecting said second peripheral power supply line and at least one of said external terminals.

2. A semiconductor integrated circuit device according to claim 1, wherein said first peripheral power supply line has a larger width than that of said second peripheral power supply line.

3. A semiconductor integrated circuit device according to claim 1, further comprising:
    a plurality of input/output cells formed on said main surface and below said peripheral power supply lines, said input/output cells enclosing said internal circuit forming region;
    a second inter-layer insulating film formed on said main surface to cover said input/output cells, said first peripheral power supply line being formed on said second interlayer insulating film; and
    a second power leading line formed on said second interlayer insulating film and integrally with said first peripheral power supply line and electrically connecting said first peripheral power supply line and at least one of said external terminals,
    wherein said first power leading line is formed integrally with said second peripheral power supply line, and
    wherein said first and second peripheral power supply lines feed different power voltages to said input/output cells.

4. A semiconductor integrated circuit device according to claim 3, further comprising a plurality of first power leading lines and second power leading lines, said first power leading lines each electrically connecting said second peripheral power supply line and one of said external terminals and said second power leading lines each electrically connecting said first peripheral power supply line and one of said external terminals; and a plurality of high drive power output buffer circuits, wherein at least two adjacent of said input/output cells form each of said high drive power output buffer circuits, wherein each of said high drive power output buffer circuit is electrically connected to one of said external terminals which is not connected to either of said first and second peripheral power supply lines.

5. A semiconductor integrated circuit device according to claim 4, wherein said high drive power output circuits are contiguously arranged next to each other, wherein the external terminals that are electrically connected to said high drive power output circuits are situated between the external terminals that are electrically connected to said first and second peripheral power supply lines.

6. A semiconductor integrated circuit device according to claim 5, further comprising wiring lines electrically connected between and within said two adjacent input/output cells which form said high drive power output circuit, wherein said second inter-layer insulating film is formed over said wiring lines.

7. A semiconductor integrated circuit device comprising:

a semiconductor substrate having a main surface including an internal circuit forming region;

a plurality of input/output cells formed on said main surface and arranged along the periphery of said internal circuit forming region;

a plurality of high drive power output buffer circuits, wherein at least two adjacent of said input/output cells forming each of said high drive power output buffer circuits;

a first inter-layer insulating film so formed on said main surface as to cover said main surface and said input/output cells;

power supply wiring means for feeding power voltages to said high drive power output buffer circuits, said power supply wiring means includes first and second peripheral power supply lines formed over said first inter-layer insulating film and said input/output cells, said first and second peripheral supply lines surrounding said internal circuit forming region; and a plurality of external terminals so formed over said main surface as to correspond to said input/output cells individually, wherein at least one of said external terminals corresponding to the plurality of input/output cells for constituting said high drive power output buffer circuits is electrically connected to said power supply wiring means.

8. A semiconductor integrated circuit device according to claim 7, further comprising:

a second inter-layer insulating film formed over said main surface to cover said input/output cells, wherein said first peripheral power supply line is arranged in the outermost periphery of said internal circuit forming region and is formed on said first inter-layer insulating film, wherein said second inter-layer insulating film is formed over said first inter-layer insulating film and said first peripheral power supply line, and wherein said second peripheral power supply line is formed on said second inter-layer insulating film and is positioned internally of and adjacent to said first peripheral power supply line;

wherein said power supply wiring means includes first power leading lines integrally formed with said second peripheral power supply line and on said second inter-layer insulating film and over said first peripheral power supply line, and second power leading lines integrally formed with said first peripheral power supply line and on said first inter-layer insulating film, and wherein said first and second power leading lines are electrically connected to said external terminals, wherein at least two adjacent of said input/output cells form each of said high drive power output buffer circuits and wherein each of said high drive power output buffer circuit is electrically connected to one of said external terminals which is not connected to either of said first and second peripheral power supply lines.

9. A semiconductor integrated circuit device according to claim 8, wherein said high drive power output circuits are contiguously arranged next to each other, wherein the external terminals that are electrically connected to said high drive power output circuits are situated between the external terminals that are electrically connected to said first and second peripheral power supply lines.

10. A semiconductor integrated circuit device according to claim 9, further comprising wiring lines electrically connected between and within said two adjacent input/output cells which form said high drive power output circuit, wherein said second inter-layer insulating film is formed over said wiring lines.

11. A semiconductor integrated circuit device according to claim 3, wherein said first and second peripheral power supply lines carry reference and power source potentials, respectively.

12. A semiconductor integrated circuit device according to claim 3, wherein said first and second peripheral power supply lines carry power and reference source potentials, respectively.

13. A semiconductor integrated circuit device comprising:

a semiconductor substrate having a main surface including an internal circuit forming region;

a plurality of input/output cells formed on said main surface and arranged along the periphery of said internal circuit forming region;

a first inter-layer insulating film formed on said main surface to cover said main surface and said input/output cells;

power supply wiring means for feeding a reference potential and a power source potential to said input/output cells, said power supply wiring means formed over said input/output cells and surrounding said internal circuit forming region, said power supply wiring means including first and second peripheral power supply lines, said second peripheral power supply line being situated adjacent to said first peripheral power supply line and between said first peripheral power supply line and said internal circuit forming region, wherein said first peripheral power supply is formed on said first inter-layer insulating film;

a plurality of external terminals formed over said main surface and outside of said power supply wiring means;

a second inter-layer insulating film formed over said first peripheral power supply line and said first inter-layer insulating film to cover said main surface, said second peripheral power supply line being formed on said second interlayer insulating film; and power leading line means for electrically connecting said power supply wiring means to said external terminals, said power leading lines means including first and second power leading lines, said first power leading lines each being integrally formed with said first peripheral power supply line and formed on said first inter-layer insulating film, said second power leading line being integrally formed with said second peripheral power supply line and formed on said second inter-layer insulating film and over said first peripheral power supply line, wherein said first and second external peripheral power supply lines are electrically connected to said external terminals through said first and second power leading lines, respectively.

14. A semiconductor integrated circuit device according to claim 13, further comprising:

a plurality of high drive power output buffer circuits, wherein at least two adjacent of said input/output cells form each of said high drive power output buffer circuits, wherein each of said high drive power output buffer circuit is electrically connected to one of said external terminals which is not connected to either of said first and second peripheral power supply lines.

15. A semiconductor integrated circuit device according to claim 14, wherein said high drive power output circuits are contiguously arranged next to each other, wherein the external terminals that are electrically connected to said high drive power output circuits are situated between the external terminals that are electrically connected to said first and second peripheral power supply lines.

16. A semiconductor integrated circuit device according to claim 15, further comprising high drive power output circuit wiring lines electrically connected between and within said two adjacent input/output cells which form said high drive power output circuit, wherein said second inter-layer insulating film is formed over said wiring lines.

17. A semiconductor integrated circuit device according to claim 16, wherein said first and second peripheral power supply lines carry reference and power source potentials, respectively.

18. A semiconductor integrated circuit device according to claim 16, wherein said first and second peripheral power supply lines carry power and reference source potentials, respectively.

19. A semiconductor integrated circuit device according to claim 13, wherein said first peripheral power supply line has a larger width than that od said second peripheral power supply line.

* * * * *